(12) United States Patent
Miller

(10) Patent No.: US 7,746,937 B2
(45) Date of Patent: Jun. 29, 2010

(54) EFFICIENT WIRED INTERFACE FOR DIFFERENTIAL SIGNALS

(75) Inventor: Charles A. Miller, Fremont, CA (US)

(73) Assignee: FormFactor, Inc., Livermore, CA (US)

( * ) Notice: Subject to any disclaimer, the term of this patent is extended or adjusted under 35 U.S.C. 154(b) by 1111 days.

(21) Appl. No.: 11/279,816

(22) Filed: Apr. 14, 2006

(65) Prior Publication Data

US 2007/0241836 A1    Oct. 18, 2007

(51) Int. Cl.
*H04B 3/00* (2006.01)
*H04L 27/00* (2006.01)

(52) U.S. Cl. ...................... 375/257; 375/295

(58) Field of Classification Search ................ 375/219, 375/257, 259, 260, 261, 346, 244, 295, 318, 375/330; 326/30, 80, 86; 330/69; 333/1, 333/12, 100; 455/39, 91, 283, 500; 370/284; 327/52, 89, 96, 127, 229, 246, 287, 359, 327/563
See application file for complete search history.

(56) References Cited

U.S. PATENT DOCUMENTS

| | | | |
|---|---|---|---|
| 5,315,175 A * | 5/1994 | Langner | 326/21 |
| 6,556,628 B1 | 4/2003 | Poulton et al. | |
| 7,505,521 B2 * | 3/2009 | Cho et al. | 375/257 |
| 7,508,881 B2 * | 3/2009 | Choi et al. | 375/288 |
| 7,561,625 B1 * | 7/2009 | Searles et al. | 375/257 |
| 2005/0108838 A1 * | 5/2005 | Schaefer et al. | 15/22.1 |
| 2006/0001483 A1 * | 1/2006 | Cioffi et al. | 330/10 |
| 2006/0013331 A1 * | 1/2006 | Choi et al. | 375/288 |
| 2009/0039975 A1 * | 2/2009 | Schubert et al. | 333/12 |

* cited by examiner

*Primary Examiner*—Tesfaldet Bocure
*Assistant Examiner*—Lawrence B Williams
(74) *Attorney, Agent, or Firm*—N. Kenneth Burraston

(57) ABSTRACT

A plurality of differential signal transmitters can transmit data signals differentially through a plurality of conductive signal lines. Ones of the signal lines can be shared between transmitters, and others of the signal lines need not be shared between transmitters.

27 Claims, 14 Drawing Sheets

EFFICIENT WIRED INTERFACE FOR DIFFERENTIAL SIGNALS

BACKGROUND

FIG. 1 illustrates a simplified schematic diagram of a prior art circuit 100 for transmitting a data bit D by differential signaling. As shown, the data bit D is input 102 to a driver 104, which can drive the bit D (e.g., in the form of a voltage or current) onto a first conductive signal line 106. Driver 104 also can drive a compliment of the bit D onto a second conductive signal line 108. As also shown, ends of the first signal line 106 and the second signal line 108 are input into a receiver 110, which outputs 112 the bit D. Advantages of differential signaling are known and include noise and interference immunity. That is, noise and interference will not typically change the value of the bit D as it is transmitted from driver 104 to receiver 110. This is because the output 112 of receiver 110 derives from the difference between the signal on the first line 106 and the signal on the second line 108, and any noise or interference that affects the transmission of the bit D from driver 104 to receiver 110 will typically affect both the first line 106 and the second line 108 in the same way and thus will typically not affect the difference between the signals on the first line 106 and the second line 108. Disadvantages of differential signaling are also well known and include an increase in the number of conductive lines 106, 108 needed to transmit one bit D. As can be seen, the circuit shown in FIG. 1 requires two signal lines 106, 108 to transmit one bit D. The present invention is directed to improvements in differential signaling.

SUMMARY

In some embodiments of the invention, a plurality of differential signal transmitters can transmit data signals differentially through a plurality of conductive signal lines. Ones of the signal lines can be shared between transmitters, and others of the signal lines need not be shared between transmitters.

DESCRIPTION OF THE DESCRIPTION

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein.

Figure 2:
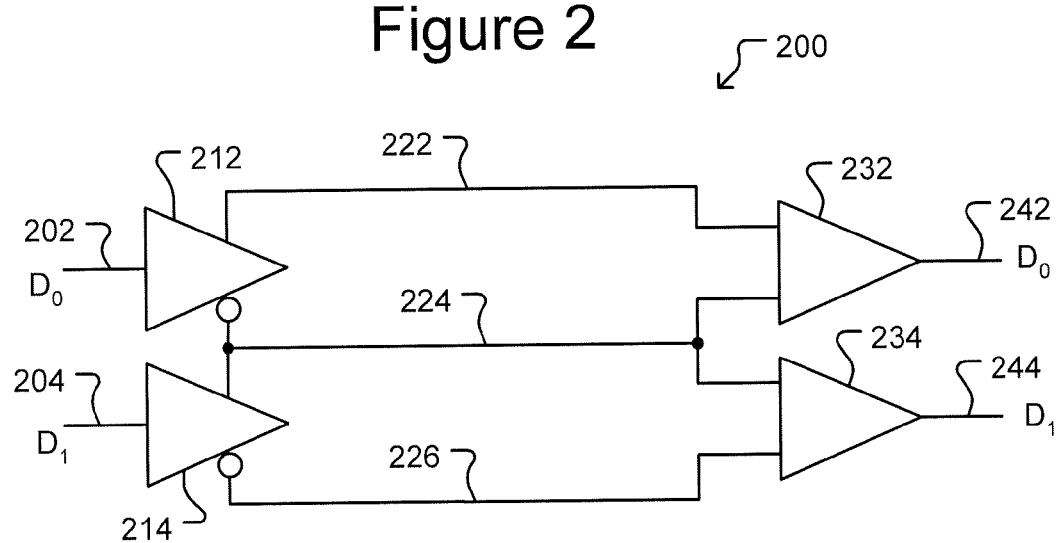
FIG. 2 depicts an exemplary circuit in simplified schematic format for transmitting two data bits by differential signaling according to some embodiments of the invention.

FIG. 2 illustrates a simplified schematic diagram of a circuit 200 for transmitting by differential signaling two data bits $D_0$, $D_1$ according to some embodiments of the invention. As will be seen, the circuit 200 can utilize a shared conductive signal line 224 to reduce the number of signal lines required to transmit the data bits $D_0$, $D_1$.

As shown in FIG. 2, circuit 200 can include two drivers 212, 214. A first driver 212 can receive as input 202 the first data bit $D_0$, and a second driver 214 can receive as input 204 the second data bit $D_1$. The first driver 212 can drive the first bit $D_0$ onto conductive signal line 222 and a complement of the first bit $D_0$ onto shared signal line 224. For example, assuming data bits $D_0$, $D_1$ are binary and thus have two possible states—e.g., a logic high state, and a logic low state—the driver 212 can drive data bit $D_0$ onto line 222 by driving a voltage or current representation of the logic state of $D_0$ at input 202 onto line 222, and driver 212 can drive the complement of data bit $D_0$ onto shared line 224 by driving a voltage or current representation of the opposite logic state (i.e., the complementary logic state) of $D_0$ at input 202 onto shared line 224. The second driver 214 can drive the second data bit $D_1$ onto shared signal line 224 and a complement of the second bit $D_1$ onto conductive signal line 226. The second driver 214 can do so by driving a voltage or current representation of the logic state of $D_1$ at input 204 onto shared line 224, and driver 214 can drive the complement of data bit $D_1$ onto line 226 by driving a voltage or current representation of the opposite logic state of $D_1$ at input 204 onto line 226.

Figure 1:
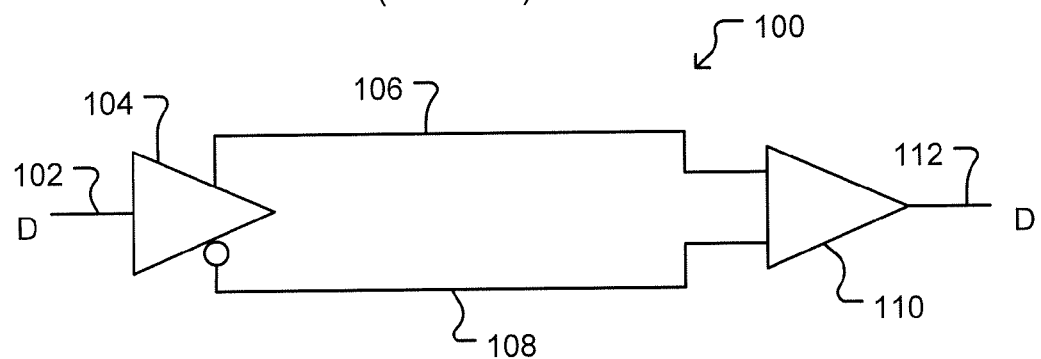
FIG. 1 shows a prior art circuit for transmitting a data bit by differential signaling.

As shown in FIG. 2, line 222 and shared line 224 are input into receiver 232, and shared line 224 and line 226 are input into receiver 234. As will be seen, receivers 232, 234 can be differential amplifiers and can thus sense the difference in the signals at their inputs. For example, receiver 232 can sense and output 242 a signal proportional to the difference in the voltage or current at its input from line 222 and the voltage or current at its input from shared line 224. Similarly, receiver 234 can sense and output 244 a signal proportional to the difference in the voltage or current at its input from shared line 224 and the voltage or current at its input from line 226. The output 242 of receiver 232 is the first bit $D_0$ input 202 into driver 212, and the output 244 of receiver 234 is the second bit $D_1$ input 204 into driver 214. Thus, by using a shared signal line 224, the circuit 200 can transmit two data bits $D_0$, $D_1$ differentially using less than the four lines that would be required using a circuit like circuit 100 of FIG. 1.

Figure 3:
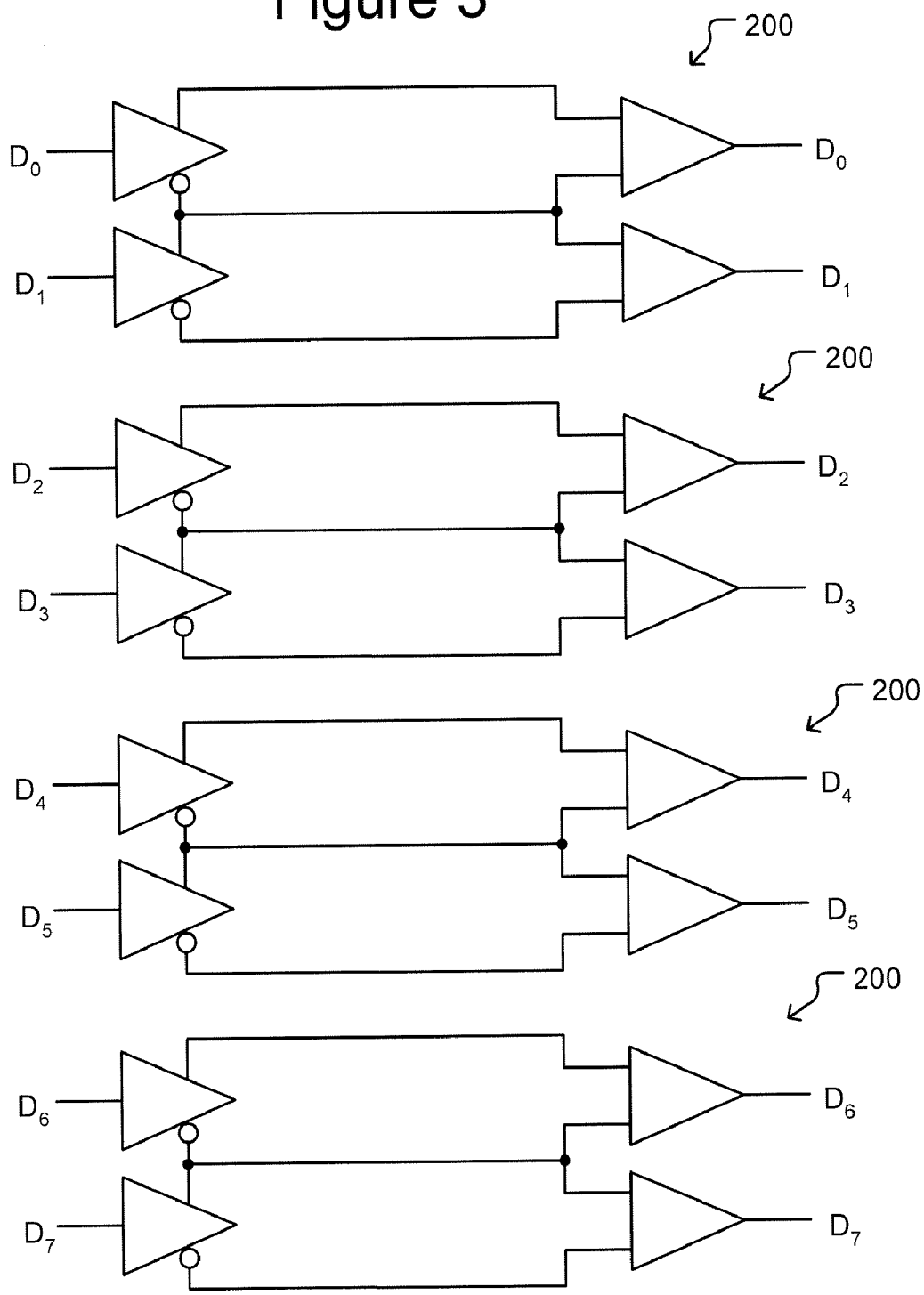
FIG. 3 shows use of a plurality of the circuits of FIG. 2 to transmit a plurality of data bits according to some embodiments of the invention.

Multiple instances of the circuit 200 of FIG. 2 can be used to transmit by differential signaling any number of data bits. FIG. 3 illustrates an example in which four circuits 200 are used to transmit by differential signaling eight data bits $D_0$, $D_1$, $D_2$, $D_3$, $D_4$, $D_5$, $D_6$, $D_7$ over twelve signal lines. As shown, each of the circuits 200 transmits a pair of bits. That is, one of the circuits 200 transmits data bits $D_0$, $D_1$; another of the circuits 200 transmits data bits $D_2$, $D_3$; another circuit 200 transmits bits $D_4$, $D_5$; and yet another of the circuits 200 transmits bits $D_6$, $D_7$. Of course more or fewer than four circuits 200 can be used to transmit more or fewer than eight bits $D_0$, $D_1$, $D_2$, $D_3$, $D_4$, $D_5$, $D_6$, $D_7$.

Figure 4:
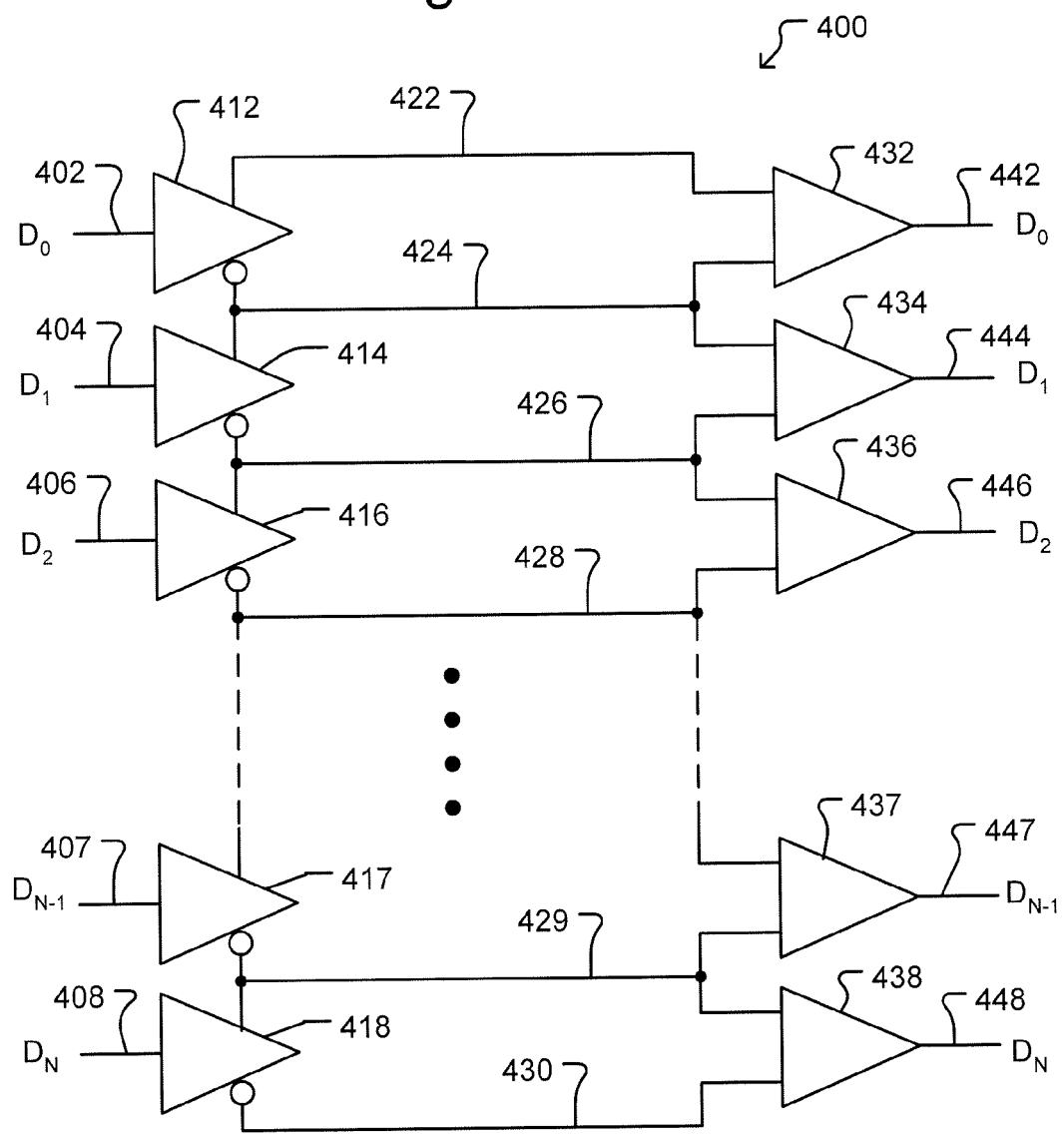
FIG. 4 depicts an exemplary circuit in simplified schematic format for transmitting a plurality of data bits by differential signaling according to some embodiments of the invention.

FIG. 4 illustrates a simplified schematic diagram of a circuit 400 for transmitting by differential signaling "N" data bits $D_0$, $D_1$, $D_2$, ... $D_{N-1}$, $D_N$ using N+1 signal lines 422, 424, 426, 428, 429, 430 according to some embodiments of the invention. As will be seen, the circuit 400 can utilize a plurality of shared conductive signal lines 424, 426, 428, 429 to reduce the number of signal lines required to transmit the data bits $D_0$, $D_1$, $D_2$, ... $D_{N-1}$, $D_N$.

As shown in FIG. 4, circuit 400 can include a plurality of drivers 412, 414, 416, 417, 418, a plurality of conductive signal lines 422, 424, 426, 428, 429, 430, and a plurality of receivers 432, 434, 436, 437, 438. Although five drivers 412, 414, 416, 417, 418, six signal lines 422, 424, 426, 428, 429, 430, and five receivers 432, 434, 436, 437, 438 are shown, more of fewer can be used in other implementations. Indeed, the number of drivers 412, 414, 416, 417, 418 and the number of receivers 432, 434, 436, 437, 438 can correspond to the number N of data bits $D_0$, $D_1$, $D_2$, ... $D_{N-1}$, $D_N$ to be transmitted, and the number of signal lines 422, 424, 426, 428, 429, 430 can correspond to one plus the number N of data bits $D_0$, $D_1$, $D_2$, ... $D_{N-1}$, $D_N$ to be transmitted. Drivers 412, 414, 416, 417, 418 can be generally similar to drivers 212, 214 of FIG. 2, and receivers 432, 434, 436, 437, 438 can be generally similar to receivers 242, 244 of FIG. 2.

As shown in FIG. 4, a first driver 412 can receive as input 402 a first data bit $D_0$ and drive the data bit $D_0$ onto signal line 422. Driver 412 can also drive a complement of the first data bit $D_0$ onto shared signal line 424. As also shown, receiver 432 can receive as inputs signal line 422 and shared signal line 424 and can output 442 the first data bit $D_0$. Driver 412, signal line 422, shared signal line 424, and receiver 432 can thus be connected and function the same as or similar to driver 212, signal line 222, shared signal line 224, and receiver 232 of FIG. 2.

As also shown in FIG. 4, a last driver 418 can receive as input 408 a last data bit $D_N$ and drive the last data bit $D_N$ onto shared signal line 429 and a complement of the last data bit $D_N$ onto signal line 430. As also shown, receiver 438 can receive as inputs shared signal line 429 and signal line 430 and can output 448 the last data bit $D_N$. Driver 418, shared signal line 429, signal line 430, and receiver 438 can thus be connected and function the same as or similar to driver 214, shared signal line 224, signal line 226, and receiver 234 of FIG. 2.

As also shown in FIG. 4, a plurality of drivers 414, 416, 417 (three are shown but more or fewer can be used) can be disposed between the first driver 412 and the last driver 418. Each such driver 414, 416, 417 can receive as input 404, 406, 407 one of the data bits $D_1$, $D_2$, ... $D_{n-1}$ and drive the data bit $D_1$, $D_2$, ... $D_{n-1}$ at its input onto a shared signal line 424, 426, 428, 429 and the complement of the data bit onto another shared signal line 424, 426, 428, 429. In this way, driver 414 can drive second data bit $D_1$ down shared line 424 and the complement of second data bit $D_1$ down shared line 426; driver 416 can drive third data bit $D_2$ down shared line 426 and the complement of third data bit $D_2$ down shared line 428; and driver 417 can driver a next to last data bit $D_{N-1}$ down shared line 428 and the complement of the next to last data bit $D_{N-1}$ down shared line 429.

As shown in FIG. 4, each of a plurality of receivers 434, 436, 437 can be disposed between receivers 432, 438 and can receive as inputs from two of the signal lines 422, 424, 426, 428, 429, 430 one of the data bits $D_0$, $D_1$, $D_2$, ... $D_{N-1}$, $D_N$ and its complement. For example, receiver 434 can receive as inputs the second data bit $D_1$ and its complement driven by driver 414 onto shared line 424 and shared line 426, and receiver 434 can generate as output 444 the second data bit $D_1$; receiver 436 can receive as inputs the third data bit $D_2$ and its complement driven by driver 416 onto shared line 426 and shared line 428, and receiver 436 can generate as output 446 the third data bit $D_2$; and receiver 437 can receive as inputs the next to last data bit $D_{N-1}$ and its complement driven by driver 417 onto shared line 428 and shared line 429, and receiver 437 can generate as output 447 the next to last data bit $D_{N-1}$.

Additional drivers (e.g., like any of drivers 414, 416, 417) can be disposed between driver 416 and driver 417, and additional signal lines (e.g., like any of signal lines 424, 426, 428, 429) can be disposed between signal lines 428, 429. Additional receivers (e.g., like any of receivers 434, 436, 437) can likewise be disposed between receivers 436, 437. In this way, additional data bits between $D_2$ and $D_{N-1}$ can be transmitted by differential signaling. In the circuit 400 shown in FIG. 4, N can thus be any integer number two or greater. (If N is two, the circuit 400 reduces to the circuit 200 of FIG. 2.) For example, N can be three, four, five, six, seven, eight, sixteen, thirty-two, sixty-four, one-hundred twenty-eight, etc. or any integer number in between. Note that, if N is three, two of the drivers, two of the signal lines, and two of the receivers shown in FIG. 4 would not be used and need not be present. Likewise, if N is four, one of the drivers, one of the signal lines, and one of the receivers shown in FIG. 4 would not be used and need not be present.

It should be noted that multiple instances of the circuit 400 of FIG. 4 can be used to transmit a plurality of data bits. For example, four instances of circuit 400 in which N is three can be arranged as shown in FIG. 3 (the four instances of circuit 400 taking the places of circuits 200 in FIG. 3) to transmit twelve bits by differential signaling using sixteen signal lines. As another example, two instances of circuit 400 in which N is four can be used to transmit by differential signaling eight data bits on ten signal lines. Generalizing, X instances of circuit 400 can be utilized to transmit by differential signaling X*N data bits over X*(N+1) signal lines, where * represents multiplication.

Figure 5:
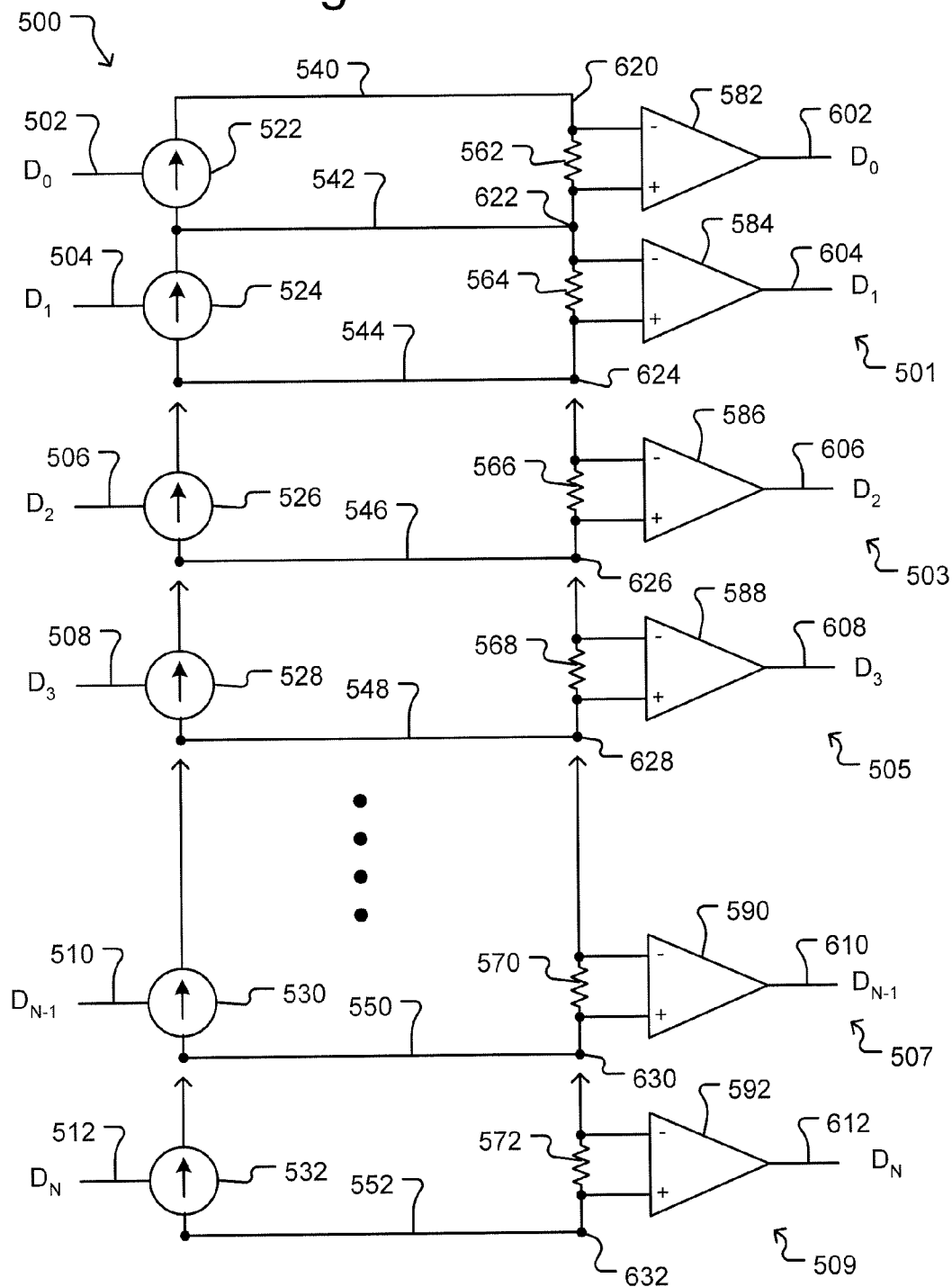
FIG. 5 depicts an exemplary circuit in simplified schematic format in which drivers are implemented as current sources according to some embodiments of the invention.

FIG. 5 illustrates a simplified schematic depiction of a circuit 500, which can be used to represent an implementation of circuit 200 of FIG. 3 or circuit 400 of FIG. 4 in which each driver 212, 214 of FIG. 2 or each driver 412, 414, 416, 417, 418 of FIG. 4 is implemented as a current source 522, 524, 526, 528, 530, 532 and each receiver 232, 234 of FIG. 2 or each receiver 432, 434, 436, 437, 438 of FIG. 4 is implemented as a resistor 562, 564, 566, 568, 570, 572 and a differential amplifier 582, 584, 586, 588, 590, 592 according to some embodiments of the invention.

As shown in FIG. 5, circuit 500 can consist solely of a subcircuit 501, which as shown, can comprise two current sources 522, 524 configured to transmit by differential signaling two data bits $D_0$, $D_1$ over three signal lines 540, 542, 544 to two differential amplifiers 582, 584. Consisting solely of subcircuit 501, circuit 500 can implement the circuit 200 of FIG. 2. That is, current source 522 can implement the driver 212 of FIG. 2; current source 524 can implement the driver 214 of FIG. 2; resistor 562 and differential amplifier 582 can implement the receiver 232 of FIG. 2; and resistor 564 and differential amplifier 584 can implement the receiver 234 of FIG. 2. Signal lines 540, 542, 544 can be like signal lines 222, 224, 226 of FIG. 2. Thus, configured with current sources 522, 524, signal lines 540, 542, 544, resistors 562, 564, and differential amplifiers 582, 584, circuit 500 (consisting of subcircuit 501) can be configured to transmit two data bits $D_0$, $D_1$ from inputs 502, 504 over three signal lines 540, 542, 544 to outputs 602, 604 of differential amplifiers 582, 584 by differential signaling. In some embodiments, the resistance of resistors 562, 564, 566, 568, 570, 572 can be equal or approximately equal to the characteristic impedance $Z_0$ of corresponding pairs of the signal lines 540, 542, 544, 546, 548, 550, 552.

As also shown in FIG. 5, the circuit 500 can be expanded to implement a circuit like circuit 400 of FIG. 4. For example, to expand circuit 500 to transmit three data bits $D_0$, $D_1$, $D_2$ an additional subcircuit 503 comprising an addition current source 526, an additional signal line 546, an additional resistor 566, and an addition differential amplifier 586, can be added to subcircuit 501. The combination of subcircuits 501, 503 can transmit three data bits $D_0$, $D_1$, $D_2$ from inputs 502, 504, 506 of current sources 522, 524, 526 over four signal lines 540, 542, 544, 546 to the outputs 602, 604, 606 of differential amplifiers 582, 584, 586.

As another example, to further expand circuit 500 to transmit four data bits $D_0$, $D_1$, $D_2$, $D_3$ yet another subcircuit 505 comprising another current source 528, another signal line 548, another resistor 568, and another differential amplifier 588 can be added to subcircuits 501, 503. The combination of subcircuits 501, 503, 505 can transmit four data bits $D_0$, $D_1$, $D_2$, $D_3$ from inputs 502, 504, 506, 508 of current sources 522, 524, 526, 528 over five signal lines 540, 542, 544, 546, 548 to the outputs 602, 604, 606, 608 of differential amplifiers 582, 584, 586, 588.

To transmit additional data bits, additional subcircuits can be added. For example, subcircuit 507 comprising current source 530 with input 510 for receiving data bit $D_{N-1}$, signal line 550, resistor 570, and differential amplifier 590 with output 610 can be added, and subcircuit 509 comprising current source 532 with input 512 for receiving data bit $D_N$, signal line 552, resistor 572, and differential amplifier 592 with output 612 can be added as shown in FIG. 5. As should be apparent, circuit 500 can be expanded to transmit by differential signaling any number N of data bits over N+1 signal lines by simply adding additional subcircuits like any of subcircuits 503, 505, 507, 509.

Correlating the specific configuration shown in FIG. 5 to the circuit 400 of FIG. 4, current source 522 can implement driver 412 of FIG. 4; current source 524 can implement the driver 414 of FIG. 4; current source 526 can implement the driver 416 of FIG. 4; current source 530 can implement the driver 417 of FIG. 4; and current source 532 can implement the driver 418 of FIG. 4. Current source 528 can implement an additional driver (not shown) in FIG. 4 located between driver 416 and driver 417. Of course additional current sources (not shown) can be disposed between current source 528 and current source 530 to drive current onto additional signal lines (not shown) and thus differentially transmit data bits between $D_3$ and $D_{n-1}$ (not shown). Signal lines 546, 548, 550, 552 can be like signal likes 540, 542.

In addition, resistor 562 and differential amplifier 582 in FIG. 5 can implement the receiver 432 of FIG. 4; resistor 564 and differential amplifier 584 in FIG. 5 can implement the receiver 434 of FIG. 4; resistor 566 and differential amplifier 586 in FIG. 5 can implement the receiver 436 of FIG. 4; resistor 570 and differential amplifier 590 in FIG. 5 can implement the receiver 437 of FIG. 4; and resistor 572 and differential amplifier 592 in FIG. 5 can implement the receiver 438 of FIG. 4. Resistor 568 and differential amplifier 588 can implement an additional receiver (not shown) in FIG. 4 located between receiver 436 and receiver 437. Of course additional resistors (not shown) and differential amplifiers (not shown) can be disposed between differential amplifier 588 and differential amplifier 590 to receive current driven down additional signal lines (not shown) for additional data bits between $D_3$ and $D_{n-1}$ (not shown).

In FIG. 5, each current source 522, 524, 526, 528, 530, 532 can be a digital driver circuit configured to generate a high or a low current in response to the state of its input 502, 504, 506, 508, 510, 512. For example, as is known, in digital logic systems, in response to a logic high state on its input 502, 504, 506, 508, 510, 512, each current source 522, 524, 526, 528, 530, 532 can be configured to output a high current level (e.g., 1 milliamp, 10 milliamps, etc.), and in response to a logic low state on its input 502, 504, 506, 508, 510, 512, each current source 522, 524, 526, 528, 530, 532 can be configured to output a low current level (e.g., zero current, or a negative of the high current level). As shown in FIG. 5, each current source 522, 524, 526, 528, 530, 532 can be electrically connected to two signal lines 540, 542, 544, 546, 548, 550, 552. As also shown in FIG. 5, each resistor 562, 564, 566, 568, 570 572 can be electrically connected between two signal lines 540, 542, 544, 546, 548, 550, 552. Each resistor 562, 564, 566, 568, 570 572 can thus correspond to one of the current sources 522, 524, 526, 528, 530, 532. As also shown in FIG. 5, each differential amplifier 582, 584, 586, 588, 590, 592 can be configured to sense and amplify the voltage drop across one of resistors 562, 564, 566, 568, 570 572. Configured as shown in FIG. 5, the output 602, 604, 606, 608, 610, 612 of each differential amplifier 582, 584, 586, 588, 590, 592 corresponds to one of the data bits $D_0$, $D_1$, $D_2$, $D_3$, $D_{N-1}$, $D_N$ that are the inputs to current sources 522, 524, 526, 528, 530, 532.

As mentioned above, the circuit 500 of FIG. 5 can be configured to transmit from two to N data bits (e.g., $D_0$, $D_1$, $D_2$, $D_3$, ... $D_{N-1}$, $D_N$). As can be deduced, the greater the number of data bits that are transmitted, the greater the maximum voltage drop across the differential amplifiers (e.g. 582, 584, 586, 588, 590, 592).

The following table (Table 1) identifies voltages across resistors 562, 564 for an implementation of circuit 500 consisting of subcircuit 501 without the addition of subcircuits 503, 505, 507, 509 configured to transmit two data bits $D_0$, $D_1$. That is, Table I provides voltage data for an implementation of circuit 500 that includes only subcircuit 501. In providing the exemplary data shown in Table 1, it has been assumed that current sources 522, 524 output 10 milliamp of current in response to a high logic level on their inputs 502, 504 and -10 milliamp of current in response to a low logic level on their inputs 502, 504. It has also been assumed that resistors 562, 564 are each 100 ohms.

TABLE I

| $D_0$ | $D_1$ | Voltage from 620 to 622 | Voltage from 622 to 624 | Voltage from 620 to 624 |
|---|---|---|---|---|
| low | low | −1 volt | −1 volt | −2 volts |
| low | high | −1 volt | +1 volt | 0 volts |
| high | low | +1 volt | −1 volt | 0 volts |
| high | high | +1 volt | +1 volt | +2 volts |

$D_0$ refers to the logic level of data bit $D_0$ at input 502.
$D_1$ refers to the logic level of data bit $D_1$ at input 504.
"Voltage from 620 to 622" refers to the voltage across resistor 562 from point 620 to point 622 in FIG. 5.
"Voltage from 622 to 624" refers to the voltage across resistor 564 from point 622 to point 624 in FIG. 5.
"Voltage from 620 to 624" refers to the voltage from point 620 to point 624 in FIG. 5.

As can be seen, in the example illustrated in Table I, the maximum voltage across the differential amplifiers 582, 584 (i.e., the voltage drop from point 620 to point 624 in FIG. 5) is ±2 volts. The foregoing values of circuit elements in circuit 500 and current and voltage characteristics of circuit 500 are exemplary only and provided by way of illustration and not by way of limitation.

The next table (Table II) identifies voltages across resistors 562, 564, 566 for an implementation of circuit 500 configured to transmit three data bits $D_0$, $D_1$, $D_2$. That is, Table II is for an implementation of circuit 500 that includes only subcircuits 501, 503. In providing the exemplary data provided in Table II, it is assumed that current sources 522, 524, 526 output 10 milliamp of current in response to a high logic level on their inputs 502, 504, 506 and −10 milliamp of current in response to a low logic level on their inputs 502, 504, 506. It is also assumed that resistors 562, 564, 566 are each 100 ohms.

TABLE II

| $D_0$ | $D_1$ | $D_2$ | Voltage from 620 to 622 | Voltage from 622 to 624 | Voltage from 624 to 626 | Voltage from 620 to 626 |
|---|---|---|---|---|---|---|
| low | low | low | −1 volt | −1 volt | −1 volt | −3 volts |
| low | low | high | −1 volt | −1 volt | +1 volt | −1 volts |
| low | high | low | −1 volt | +1 volt | −1 volt | −1 volts |
| low | high | high | −1 volt | +1 volt | +1 volt | +1 volts |
| high | low | low | +1 volt | −1 volt | −1 volt | −1 volts |
| high | low | high | +1 volt | −1 volt | +1 volt | +1 volts |
| high | high | low | +1 volt | +1 volt | −1 volt | +1 volts |
| high | high | high | +1 volt | +1 volt | +1 volt | +3 volts |

$D_0$ refers to the logic level of data bit $D_0$ at input 502.
$D_1$ refers to the logic level of data bit $D_1$ at input 504.
$D_2$ refers to the logic level of data bit $D_2$ at input 506.
"Voltage from 620 to 622" refers to the voltage across resistor 562 from point 620 to point 622 in FIG. 5.
"Voltage from 622 to 624" refers to the voltage across resistor 564 from point 622 to point 624 in FIG. 5.
"Voltage from 624 to 626" refers to the voltage across resistor 566 from point 624 to point 626 in FIG. 5.
"Voltage from 620 to 626" refers to the voltage from point 620 to point 626 in FIG. 5.

As can be seen, in the example illustrated in Table II, the maximum voltage across the differential amplifiers 582, 584, 586 (i.e., the voltage drop from point 620 to point 626) in FIG. 5 is ±3 volts. The foregoing values of circuit elements in circuit 500 and current and voltage characteristics of circuit 500 are exemplary only and provided by way of illustration and not by way of limitation.

The next table (Table III) identifies voltages across resistors 562, 564, 566, 568 for an implementation of circuit 500 configured to transmit four data bits $D_0$, $D_1$, $D_2$, $D_3$. That is, Table III is for an implementation of circuit 500 that includes only subcircuits 501, 503, 505. In providing the exemplary data shown in Table III, it is assumed that current sources 522, 524, 526, 528 output 10 milliamp of current in response to a high logic level on their inputs 502, 504, 506, 508 and −10 milliamp of current in response to a low logic level on their inputs 502, 504, 506, 508. It is also assumed that resistors 562, 564, 566, 568 are each 100 ohms.

TABLE III

| $D_0$ | $D_1$ | $D_2$ | $D_3$ | Voltage from 620 to 622 | Voltage from 622 to 624 | Voltage from 624 to 626 | Voltage from 620 to 626 | Voltage from 620 to 626 |
|---|---|---|---|---|---|---|---|---|
| low | low | low | low | −1 volt | −1 volt | −1 volt | −1 volt | −4 volts |
| low | low | low | high | −1 volt | −1 volt | −1 volt | +1 volt | −2 volts |
| low | low | high | low | −1 volt | −1 volt | +1 volt | −1 volt | −2 volts |
| low | high | low | low | −1 volt | +1 volt | −1 volt | −1 volt | −2 volts |
| high | low | low | low | +1 volt | −1 volt | −1 volt | −1 volt | −2 volts |
| low | low | high | high | −1 volt | −1 volt | +1 volt | +1 volt | 0 volts |
| high | low | low | high | +1 volt | −1 volt | −1 volt | +1 volt | 0 volts |
| high | high | low | low | +1 volt | +1 volt | −1 volt | −1 volt | 0 volts |
| low | high | low | high | −1 volt | +1 volt | −1 volt | +1 volt | 0 volts |
| high | low | high | low | +1 volt | −1 volt | +1 volt | −1 volt | 0 volts |
| low | high | high | low | −1 volt | +1 volt | +1 volt | −1 volt | 0 volts |
| low | high | high | high | −1 volt | +1 volt | +1 volt | +1 volt | +2 volts |
| high | low | high | high | +1 volt | −1 volt | +1 volt | +1 volt | +2 volts |
| high | high | low | high | +1 volt | +1 volt | −1 volt | +1 volt | +2 volts |
| high | high | high | low | +1 volt | +1 volt | +1 volt | −1 volt | +2 volts |
| high | high | high | high | +1 volt | +1 volt | +1 volt | +1 volt | +4 volts |

$D_0$ refers to the logic level of data bit $D_0$ at input 502.
$D_1$ refers to the logic level of data bit $D_1$ at input 504.
$D_2$ refers to the logic level of data bit $D_2$ at input 506.
$D_3$ refers to the logic level of data bit $D_3$ at input 508.
"Voltage from 620 to 622" refers to the voltage across resistor 562 from point 620 to point 622 in FIG. 5.
"Voltage from 622 to 624" refers to the voltage across resistor 564 from point 622 to point 624 in FIG. 5.
"Voltage from 624 to 626" refers to the voltage across resistor 566 from point 624 to point 626 in FIG. 5.
"Voltage from 626 to 628" refers to the voltage across resistor 568 from point 626 to point 628 in FIG. 5.
"Voltage from 620 to 628" refers to the voltage from point 620 to point 628 in FIG. 5.

As can be seen, in the example illustrated in Table III, the maximum voltage across the differential amplifiers 582, 584, 586, 588 (i.e., the voltage drop from point 620 to point 628) in FIG. 5 is ±4 volts. The foregoing values of circuit elements in circuit 500 and current and voltage characteristics of circuit 500 are exemplary only and provided by way of illustration and not by way of limitation.

As should be apparent, the maximum voltage drop across the differential amplifiers (e.g., two or more of 582, 584, 586, 588, 590, 592) in the circuit 500 of FIG. 5 is ±N volts, where N is the number of data bits (e.g., two or more of $D_0$, $D_1$, $D_2$, $D_3$, ... $D_{N-1}$, $D_N$) transmitted, assuming each current source (e.g., two or more of 522, 524, 526, 528, 530, 532) is configured to output +10 milliamp in response to a high logic at its input (e.g., two or more of 502, 504, 506, 508, 510, 512) and −10 milliamp in response to a low logic at its input and further assuming that the resistors (e.g., 562, 564, 566, 568, 570 572) are 100 ohms each. Thus, with the same assumptions regarding the current output of current sources and the resistance of resistors, configured to transmit five data bits $D_0$, $D_1$, $D_2$, $D_3$, $D_4$, the maximum voltage drop across differential amplifiers 582, 584, 586, 588, 590 is ±5 volts (that is, the voltage from point 620 to point 630 in FIG. 5); configured to transmit six data bits, the maximum voltage drop across differential amplifiers 582, 584, 586, 588, 590, 592 is ±6 volts (that is, the voltage from point 620 to point 632 in FIG. 5). As mentioned, above, any number of additional current sources, signal lines, resistors, and differential amplifiers can be added to the circuit 500 of FIG. 5 as one way of increasing the number of data bits transmitted simultaneously. For example, with eight current sources, resistors, and differential amplifiers, circuit 500 can transmit eight data bits over nine signal lines, and the maximum voltage drop across the differential amplifiers would be eight volts (with the same assumptions regarding current output of the current sources and resistance of the resistors as discussed above). As another example, with sixteen current sources, resistors, and differential amplifiers, circuit 500 can transmit sixteen data bits over seventeen signal lines, and the maximum voltage drop across the differential amplifiers would be sixteen volts (with the same assumptions regarding current output of the current sources and resistance of the resistors as discussed above). Likewise, thirty-two current sources, resistors, and differential amplifiers, would allow circuit 500 to transmit thirty-two data bits over thirty-three signal lines, and the maximum voltage drop across the differential amplifiers would be thirty-two volts (with the same assumptions regarding current output of the current sources and resistance of the resistors as discussed above). Similarly, sixty-four current sources, resistors, and differential amplifiers, would allow circuit 500 to transmit sixty-four data bits over sixty-five signal lines, and the maximum voltage drop across the differential amplifiers would be sixty-four volts (with the same assumptions regarding current output of the current sources and resistance of the resistors as discussed above).

Alternatively, a plurality of data bits can be transmitted by differential signaling using a configuration like the configuration shown in FIG. 3 in which each driver 212, 214 (see FIG. 2) in each circuit 200 is implemented as a current source (like current sources 522, 524 in FIG. 5) and each receiver 232, 234 (see FIG. 2) is implemented as a resistor (like 562, 564 in FIG. 5) and a differential amplifier (like 582, 584 in FIG. 5) configured as shown in FIG. 5. As another alternative, a plurality of data bits can be transmitted by differential signaling using a configuration like the configuration shown in FIG. 3 in which each circuit 200 is configured to transmit three, four, or more data bits. Again, the drivers 212, 214 in each circuit 200 can be modified to transmit three or more data bits and can be implemented as a current source (as in FIG. 5) and the receivers 232, 234 in each such modified circuit 200 can be implemented as a resistor and differential amplifier (as in FIG. 5).

Figure 6:
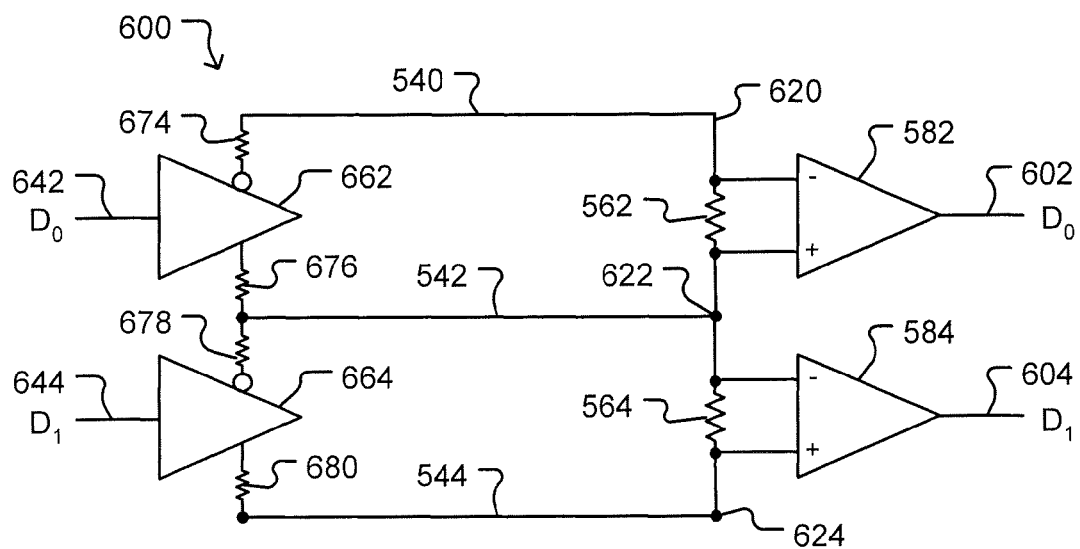
FIG. 6 depicts an exemplary circuit in simplified schematic format in which drivers are implemented as voltage sources according to some embodiments of the invention.

FIG. 6 illustrates a simplified schematic depiction of a circuit 600 representing an implementation of circuit 200 of FIG. 2 in which each driver 212, 214 of FIG. 2 is implemented as a voltage source 662, 664 and each receiver 232, 234 of FIG. 2 is implemented as a resistor 562, 564 and a differential amplifier 582, 584 according to some embodiments of the invention. As shown in FIG. 6, circuit 600 can comprise two voltage sources 662, 664 configured to transmit two data bits $D_0$, $D_1$ over three signal lines 540, 542, 544 to two differential amplifiers 582, 584. Note that the signal lines 540, 542, 544, resistors 562, 564, and differential amplifiers 582, 584 can be the same as like named and numbered elements in FIG. 5.

In FIG. 6, each voltage source 662, 664 can be a digital driver circuit configured to output both a voltage that corresponds to the logical state of its input 642, 644 and a voltage that corresponds to the complement of the logical state of its input 642, 644. For example, if the signal $D_0$ at input 642 to voltage source 662 is a high logic value, voltage source 662 can be configured to output through resistor 676 a voltage corresponding to the high logic state of input 642 (e.g., a high voltage, such as +1 volt or +5 volts) and to output through resistor 674 a voltage corresponding to the complement of the high logic state of input 642 (a low logic state) (e.g., a low voltage, such as zero volts). Voltage source 664 can be similarly configured. That is, voltage source 664 can be configured to output a voltage through resistor 680 that corresponds to the logical state (e.g., high or low) of its input 644 and to output a voltage through resistor 678 that corresponds to the complement of the logical state of its input 644.

As shown in FIG. 6, the outputs of each voltage source 662, 664 through resistors 674, 676, 678, 680 are electrically connected to two of signal lines 540, 542, 544. As also shown in FIG. 6 and discussed above with respect to FIG. 5, each resistors 562, 564 can be electrically connected between two signal lines 540, 542, 544, and each resistor 562, 564 can thus correspond to one of the voltage sources 522, 524. As also shown in FIG. 6 and discussed above with respect to FIG. 5, each differential amplifier 582, 584 can be configured to sense and amplify the voltage drop across one of resistors 562, 564. Configured as shown in FIG. 6, the output 602, 604 of each differential amplifier 582, 584, corresponds to one of the data bits $D_0$, $D_1$ that are the inputs 642, 644 to voltage sources 662, 664.

The following table (Table VI) provides exemplary voltage characteristics of the circuit of FIG. 6. The voltage characteristics in Table IV assume the following values for the elements of circuit 600: the characteristic impedance of each signal line 540, 542, 544 is approximately 2 R; the resistance of resistor 674 is R; the resistance of resistor 676 is 2 R; the resistance of resistor 678 is 2 R; the resistance of resistor 680 is R; the resistance of resistor 562 is 2 R; the resistance of resistor 564 is 2 R; the voltage output of each of voltage sources 662, 664 is +1 volt while a high logic value of $D_0$ or $D_1$ is present on input 642 or input 644; and the voltage output of each of voltage sources 662, 665 is 0 volts while a low logic value of $D_0$ or $D_1$ is present on input 642 or input 644.

TABLE IV

| $D_0$ | $D_1$ | Voltage at 620 | Voltage at 622 | Voltage at 620 | Voltage from 620 to 622 | Voltage from 622 to 624 |
|---|---|---|---|---|---|---|
| low | low | 0.83 volts | 0.5 volts | 0.17 volts | 0.33 volts | 0.33 volts |
| low | high | 0.8 volts | 0.4 volts | 0.8 volts | 0.4 volts | −0.4 volts |
| high | low | 0.2 volts | 0.6 volts | 0.2 volts | −0.4 volts | 0.4 volts |
| high | high | 0.17 volts | 0.5 volts | 0.83 volts | −0.33 volts | −0.33 volts |

$D_0$ refers to the logic level of data bit $D_0$ at input 602.
$D_1$ refers to the logic level of data bit $D_1$ at input 604.
"Voltage at 620" refers to the voltage at point 620 in FIG. 6.
"Voltage at 622" refers to the voltage at point 622 in FIG. 6.
"Voltage at 624" refers to the voltage at point 624 in FIG. 6.
"Voltage from 620 to 622" refers to the voltage across resistor 562 from point 620 to point 622 in FIG. 6.
"Voltage from 622 to 624" refers to the voltage across resistor 564 from point 622 to point 624 in FIG. 6.

As shown in FIG. 6, in some embodiments, the resistance values of the resistors 674, 676, 678, and 680 can be selected such that the resistor (e.g., 674) associated with the complimentary output of one driver (e.g., 662) has half the resistance of the resistor (e.g., 678) associated with the complimentary output of the other driver (e.g., 664), while the resistor (e.g., 676) associated with the non-complimentary output of the one driver (e.g., 662) has twice the resistance of the resistor (e.g., 680) associated with the non-complimentary output of the other driver (e.g., 664). All of the foregoing values of circuit elements in circuit 600 and voltage characteristics of circuit 600 are exemplary only and provided by way of illustration and not by way of limitation. In other configurations of the circuit 600, other values for the resistors 674, 562, 564, 680, 678, 676 can be selected, other voltage output levels can be selected for the drivers 662, 664, and other values for the characteristic impedances of the lines 540, 542, 544 can be selected. For example, the configuration of FIG. 6 can be used with signal lines 540, 542, 544 having characteristic impedances of about R. As another example, the resistors 674, 676, 678, and 680 in FIG. 6 can each have a value R. Many other configurations and selections are possible.

Although not shown in FIG. 6, the circuit 600 can be expanded to implement a circuit like circuit 400 of FIG. 4 by adding additional voltage sources (like voltage sources 662, 664), signal lines (like signal lines 540, 542, 544), and receivers (like the receiver comprising resistor 562 and differential amplifier 582 or the receiver comprising resistor 564 and differential amplifier 584).

There are many applications for circuits like the circuits 200, 400, 500, 600 shown in FIGS. 2, 4, 5, and 6 and the configuration shown in FIG. 3 including all modifications discussed herein to those circuits and configurations. One such application is transmitting signals through a probe card assembly such as can be used to test electronic devices, such as semiconductor dies.

Figure 7:
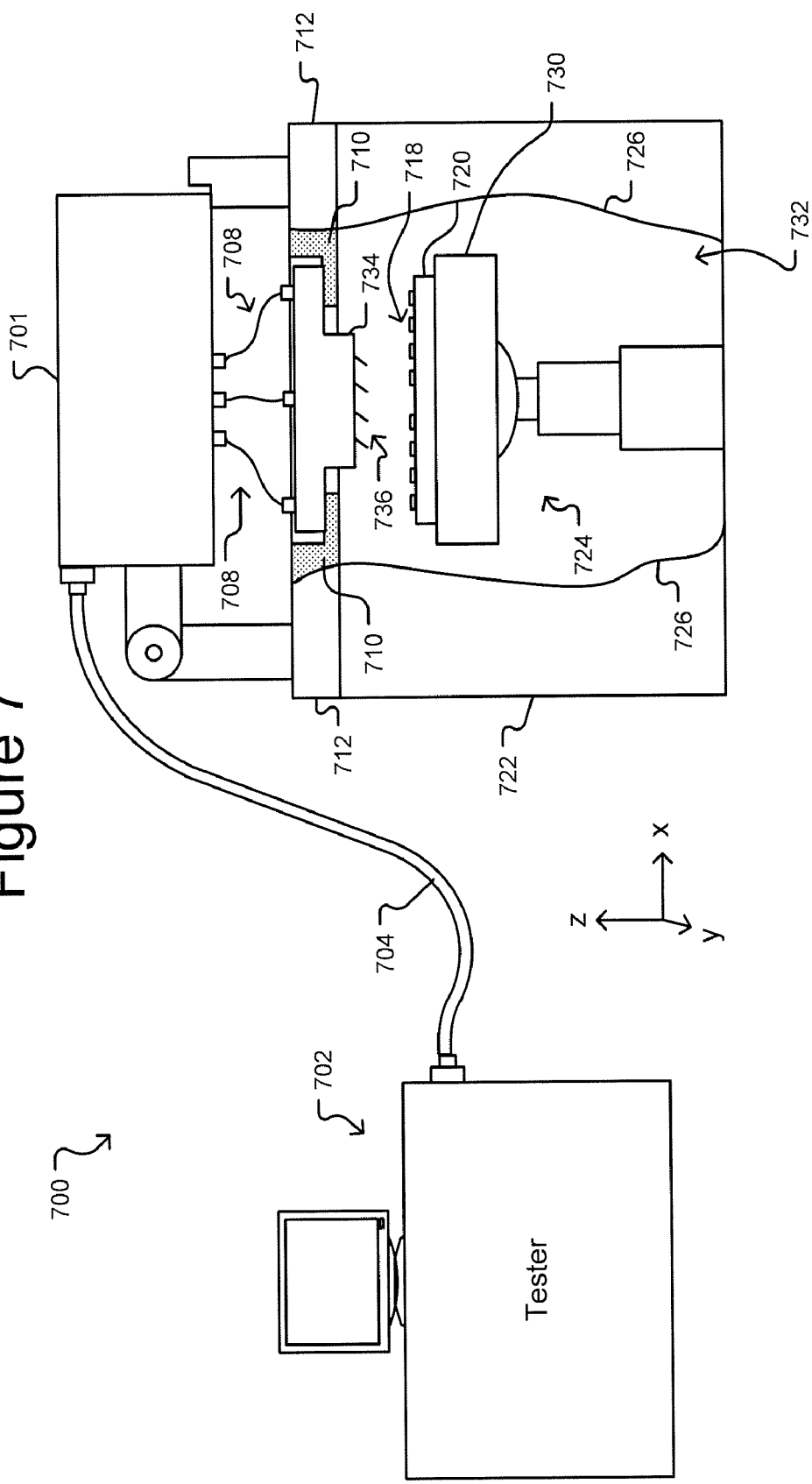
FIG. 7 illustrates a test system according to some embodiments of the invention.

FIG. 7 illustrates an exemplary test system 700 having a probe card assembly 734 in which circuits like circuits 200, 400, 500, 600 of FIGS. 2, 4, 5, and 6 and the configuration shown in FIG. 3 can be implemented according to some embodiments of the invention. The test system 700 can be configured to test a plurality of electronic devices. The electronic devices to be tested can comprise semiconductor dies of an unsingulated semiconductor wafer, semiconductor dies singulated from a wafer (packaged or unpackaged), one or more arrays of singulated dies disposed in a carrier or other holding device, multi-die electronics modules, printed circuit boards, or any other type of electronic devices. (Hereinafter the electronic devices being tested, whatever the type, are referred to as devices under test or "DUTs".)

As shown, the test system 700 can comprise a tester 702 configured to control testing of the DUTs 720. Tester 702, which can comprise one or more computers, can generate test data that can be input into DUTs 720. The tester 702 can also receive response data output by the DUTs 720 in response to the test data. Tester 702 can evaluate the response data to determine whether the DUTs 720 pass the testing and/or to rate the DUTs 720.

As also shown in FIG. 7, the test system 700 can include a prober 722, which can be a box structure with an interior chamber 732 in which is disposed a movable chuck 724 having a stage 730 for holding DUTS 720. (Cut out 726 provides a partial view into chamber 732.) Chuck 724 can be capable of moving in the "x," "y," and "z" directions, and may also be capable of tilting about the "x" and "y" axes and rotating about the "z" axis. (Directions, including without limitation "x," "y," "z," "above," "below," etc. are provided for ease of illustration and discussion and are not to be taken as limiting.) The prober 722 can include a head plate 712, which can be a solid, rigid plate structure. The head plate 712 can include an insert ring 710 to which a probe card assembly 734 comprising a plurality of probes 736 can be mounted (e.g., bolted). In use, the movable chuck 724 can align terminals 718 of DUTs 720 with ones of the probes 736. The chuck 724 can then move the terminals 718 into contact with ones of the probes 736 and thereby create electrical connections between the probes 736 and the terminals 718 of DUTs 720. Terminals 718 can include input terminals, output terminals, power terminals, ground terminals, and other terminals.

Probes 736 can be resilient, conductive structures. Non-limiting examples of suitable probes 736 include composite structures formed of a core wire bonded to a conductive terminal (not shown) on probe card assembly 734 that is over coated with a resilient material as described in U.S. Pat. Nos. 5,476,211, 5,917,707, and U.S. Pat. No. 6,336,269. Probes 136 can alternatively be lithographically formed structures, such as the spring elements disclosed in U.S. Pat. Nos. 5,994,152, 6,033,935, 6,255,126, 6,945,827, U.S. Patent Application Publication No. 2001/0044225, and U.S. Patent Application Publication No. 2004/0016119. Still other non-limiting examples of probes 736 are disclosed in U.S. Pat. Nos. 6,827,584, 6,640,432, 6,441,315, and U.S. Patent Application Publication No. 2001/0012739. Other non-limiting examples of probes 736 include electrically conductive pogo pins, bumps, studs, stamped springs, needles, buckling beams, etc.

Communications cable 704, test head 701, and electrical connections 708 (e.g., wires, electrically conductive pogo pins, etc.) between the test head 701 and the probe card assembly 734 can provide a plurality of communications channels (not shown) between tester 702 and probe card assembly 734. The communications channels provide data paths for data (e.g., test data, control data, etc.) to be provided from tester 702 to probe card assembly 734 and for data (e.g., response data output by DUTs 720, control data, status data, etc.) to be provided from probe card assembly 734 to tester 702. Power and ground, among other electrical signals, can also be provided through communications channels provided by communications cable 704, test head 701, and connections 708. Communications cable 704 can be replaced with other means of communicating data, such as wireless communications equipment.

Figure 8:
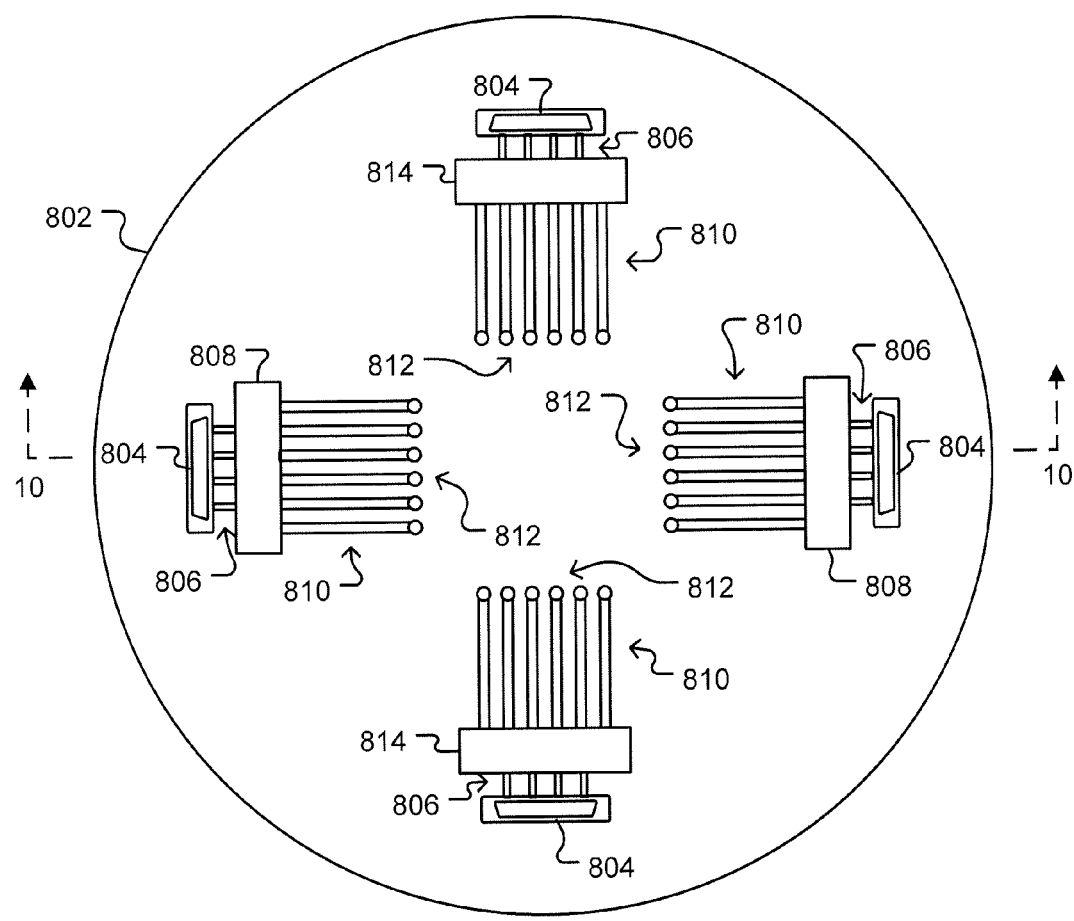
FIG. 8 illustrates a top view of an exemplary probe card assembly that can be used with the test system of FIG. 7 according to some embodiments of the invention.
Figure 9:
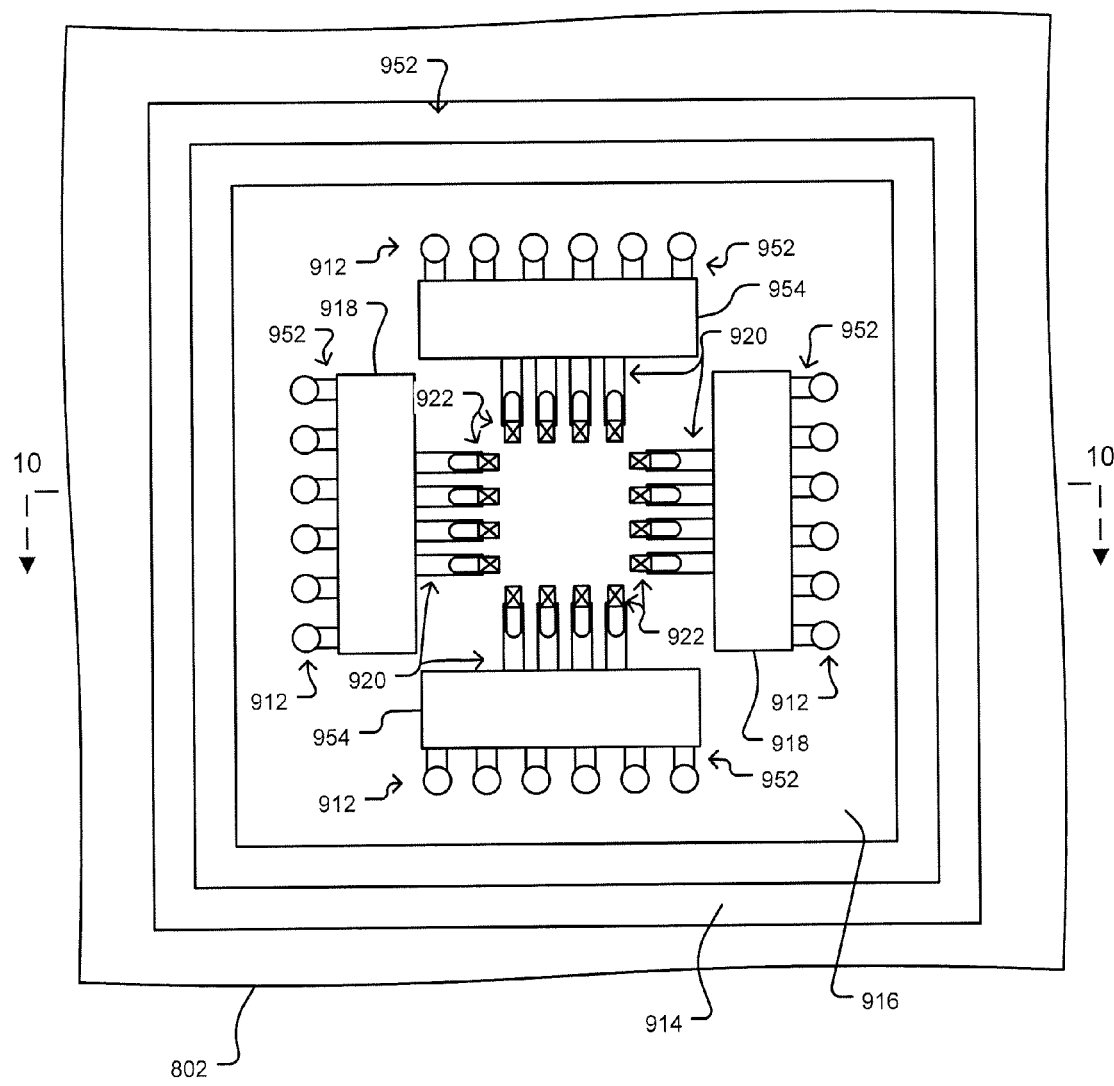
FIG. 9 shows a partial bottom view of the probe card assembly of FIG. 8.
Figure 10:
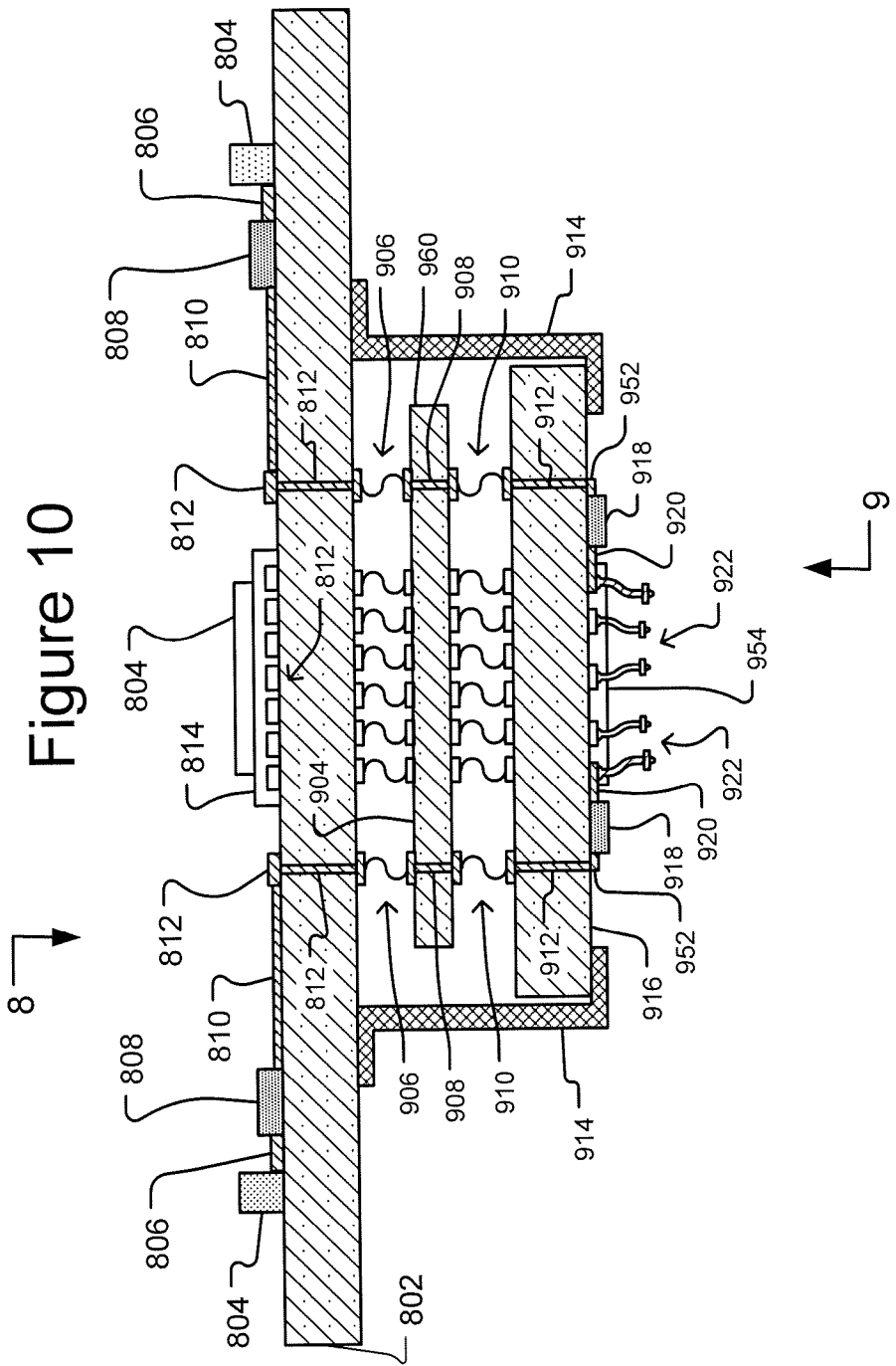
FIG. 10 shows a partial, cross-sectional, side view of the probe card assembly of FIG. 8.

FIG. 8-10 illustrate an exemplary configuration of probe card assembly 734 according to some embodiments of the invention. (FIG. 8 shows a top view, FIG. 9 shows a partial bottom view, and FIG. 10 shows a partial, side, cross-sectional view of the probe card assembly 734.) As will be seen, probe card assembly 734 can provide an electrical interface between the communications channels (through cable 704, test head 701, and electrical connections 708) from the tester 702 and the DUTS 720. As will also be seen, probe card assembly 734 can use differential signaling techniques to transmit data signals through the probe card assembly 734.

As shown in FIGS. 8-10, the probe card assembly 734 includes electrical connectors 804 disposed on a wiring substrate 802. As discussed above, the electrical connections 708, the test head 701, and the cable 704 can provide a plurality of communications channels (not shown) from the tester 702 (see FIG. 7). Electrical connectors 804 can comprise any device for making electrical connections with ones of the communications channels from the tester 702. As one example, if electrical connections 708 are electrically conductive pogo pins, connectors 804 can be conductive pogo pin pads. As another example, if electrical connections 708 are zero insertion force ("ZIF") connectors, connectors 804 can also be ZIP connectors.

Electrically conductive traces 806 on and/or within wiring substrate 802 can provide electrical connections between connectors 804 and driver electronics module 808 or receiver electronics module 814. As will be seen, driver electronics module 808 can comprise drivers (e.g., like drivers 212, 214, 412, 414, 416, 417, 418 of FIGS. 2 and 4), and receiver electronics module 814 can comprise receivers (e.g., like receivers 232, 234, 432, 434, 436, 437, 438 of FIGS. 2 and 4). A plurality of electrically conductive traces 810 on and/or within wiring substrate 802, vias 812 through wiring substrate 802, spring interconnect structures 906 (see FIG. 10), vias 908 through interposer substrate 960, spring interconnect structures 910, vias 912 through probe substrate 916, and traces 952 on and/or within probe substrate 916 can provide a plurality of electrically conductive paths between driver electronics module 808 and receiver electronics module 814 on the wiring substrate 802, on one hand, and corresponding receiver electronics module 918 and driver electronics module 954 on the probe substrate 916, on the other hand. Electrically conductive traces 920 on and/or within probe substrate 916 can provide electrical connections between the receiver electronics module 918 and driver electronics module 954 on the probe substrate 916, on one hand, and electrically conductive probes 736 attached to the probe substrate 916, on the other hand.

Figure 11:
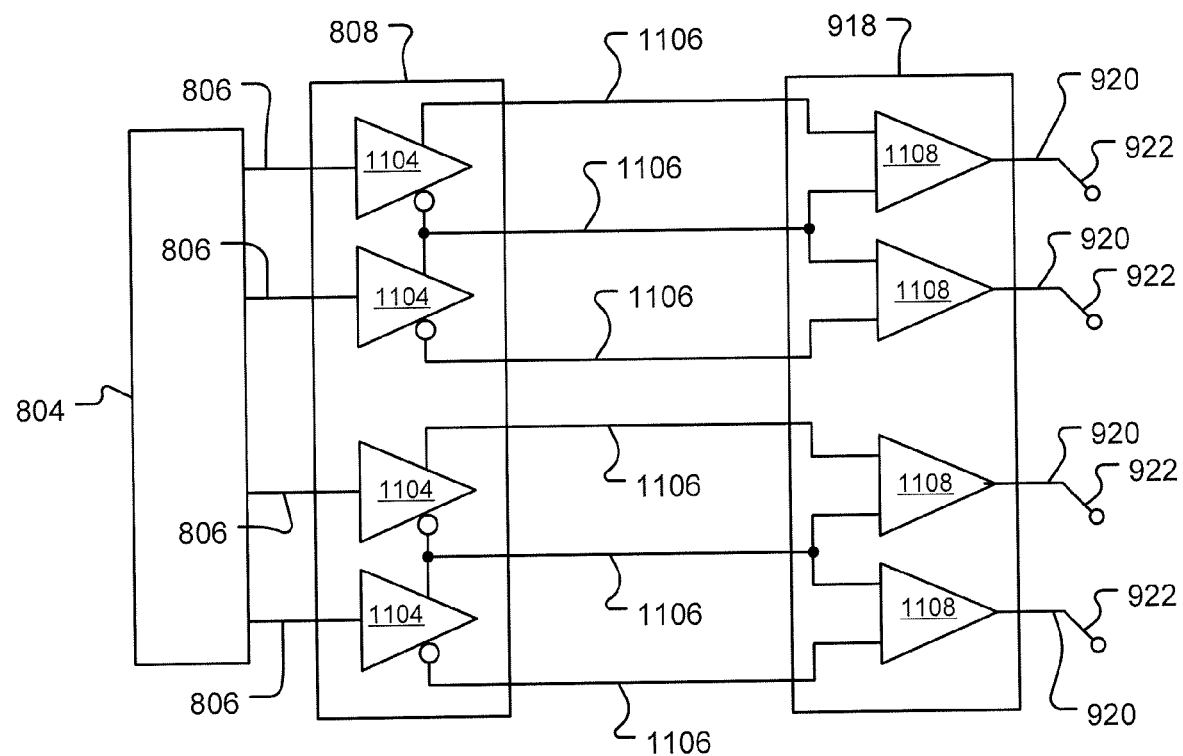
FIG. 11 illustrates a simplified, schematic depiction of an exemplary connector, driver electronics module, and receiver electronics module of the probe card assembly of FIG. 8.

FIG. 11 illustrates a simplified, schematic depiction of one connector 804, one driver electronics module 808 disposed on the wiring board 802, and one receiver electronics module 918 disposed on the probe substrate 916. As discussed above, connector 804 can make individual electrical connections with communications channels (not shown) to the tester 702, and traces 806 can electrically connect ones of those individual electrical connections with the communications channels to drivers 1104 of driver electronics module 808. Drivers 1104 can be like any of drivers 212, 214, 412, 414, 416, 417, 418 of FIGS. 2 and 4 and thus can be, for example, current sources (e.g., 552) as shown in FIG. 5 or voltage sources (e.g., 662) as shown in FIG. 6. Driver electronics module 808 can be in the form of one or more integrated circuits (e.g., "chips"). As discussed above with respect to drivers 212, 214, 412, 414, 416, 417, 418 of FIGS. 2 and 4, drivers 1104 can transmit data signals received via traces 806 by differential signaling over data paths 1106 (which can be like signal lines 222, 224, 226, 422, 424, 426, 428, 429, 430 in FIGS. 2 and 4). Data paths 1106 can be formed by traces 810 on and/or within wiring substrate 802, vias 812 through wiring substrate 802, spring interconnect structures 906, vias 908 through interposer substrate 960, spring interconnect structures 910, vias 912 through probe substrate 916, and traces 952 on and/or within probe substrate 916. As shown in FIG. 11, the data signals transmitted by drivers 1104 onto data paths 1106 can be received by receivers 1108 of receiver electronics module 918 on probe substrate 916. As will be seen, driver electronics module 808 can comprise drivers (e.g., like drivers 212, 214, 412, 414, 416, 417, 418 of FIGS. 2 and 4), and receiver electronics module 814 can comprise receivers (e.g., like receivers 232, 234, 432, 434, 436, 437, 438 of FIGS. 2 and 4). Receivers 1108 can be like any of receivers 232, 234, 412, 424, 416, 428, 429, 430 of FIGS. 2 and 4. Thus, for example, receivers 1108 can comprise a resistor and a differential amplifier like, for example, resistor 562 and differential amplifier 582 of FIGS. 5 and 6. Receiver electronics module 918 can be in the form of one or more integrated circuits (e.g., "chips"). Receivers 1108 can decode the data signals received over data paths 1106 and output the decoded signals through traces 920 on and/or within probe substrate 916 to probes 922. As discussed above, ones of probes 922 can be brought into contact with input terminals (e.g., ones of 718 of FIG. 7) of the DUTS (e.g., 720 of FIG. 7).

Figure 12:
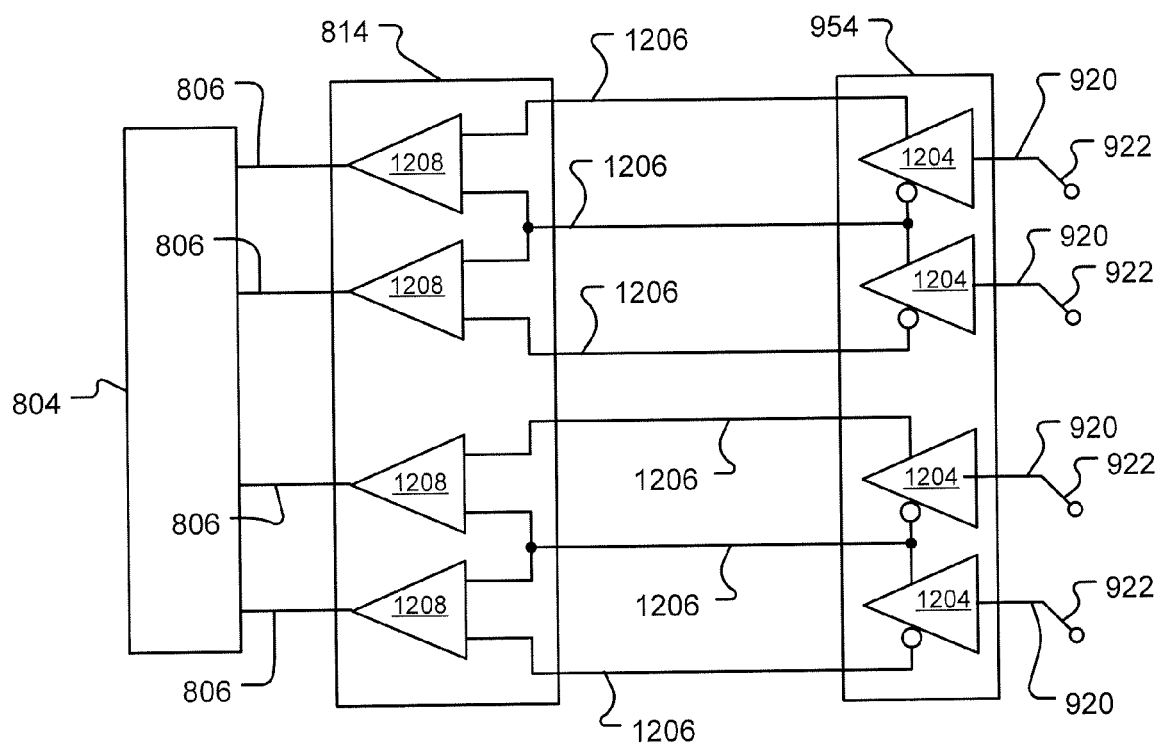
FIG. 12 illustrates a simplified, schematic depiction of an exemplary receiver electronics module, driver electronics module, and connector of the probe card assembly of FIG. 8.

FIG. 12 illustrates a simplified, schematic depiction of one driver electronics module 954 disposed on the probe substrate 916, one receiver electronics module 814 disposed on the wiring board 802, and one connector 804. The ones of probes 922 shown in FIG. 12 can make electrical connections with output terminals (e.g., ones of terminals 718 of FIG. 7) of the DUTS (e.g., 720 of FIG. 7). Data signals output by the DUTS can thus be provided to drivers 1204 of drivers electronics 954 through probes 922 and traces 920 on and/or within probe substrate 916. Drivers 1204 and driver electronics module 954 can be generally like drivers 1104 and driver electronics module 808 of FIG. 11. Drivers 1204 can transmit the data signals received via probes 922 and traces 920 by differential signaling over data paths 1206 (which can be like signal lines 222, 224, 226, 422, 424, 426, 428, 429, 430 in FIGS. 2 and 4). Like data paths 1106, data paths 1206 can be formed by traces 952 on and/or within probe substrate 916, vias 912 through probe substrate 916, spring interconnect structures 910, vias 908 through interposer substrate 960, spring interconnect structures 906, vias 812 through wiring substrate 802, and traces 810 on and/or within wiring substrate 802. Receivers 1208 can decode the data signals received over data paths 1206 and output the decoded signals through traces 806 on and/or within wiring substrate 8026 to probes connector 804. The data signals can then pass through ones of the communications channels (not shown) provided by electrical connections 708, test head 701, and cable 704 to tester 702.

Thus, test data generated by tester 702 (see FIG. 7) can be provided through cable 704, test head 701, and electrical connections 708 to electrical connectors 804 on probe card assembly 734. From connectors 804 on probe card assembly 734, the test data can be provided to drivers 1104, which transmit the test data by differential signaling over data paths 1106 through the probe card assembly 734 to receivers 1108, which decode the test data and output the test data to ones of probes 922 that are in electrical contact with input terminals 718 of DUTS 720. Response data generated by DUTS 720 in response to the test data can be provided through probes 922 that are in electrical contact with output terminals 718 of DUTS 720 to drivers 1204, which transmit the response data by differential signaling over data paths 1206 through the probe card assembly 734 to receivers 1108, which decode the response data and output the response data to connector 804, from where the response data can be transmitted through ones of the communications channels (not shown) formed by electrical connections 708, test head 701, and cable 704 to tester 702.

Referring again to FIGS. 8-10 and probe card assembly 734, the wiring board 802, interposer substrate 960, and probe substrate 916 can be held together by brackets 914 or other suitable means. The wiring substrate 802, interposer substrate 960, and probe substrate 916 can comprise any suitable material including without limitation printed circuit board material, ceramic material, organic material, inorganic material, etc.

The probe card assembly 734 illustrated in FIGS. 8-10 is exemplary only and many alternative and different configurations of a probe card assembly 734 may be used. For example, a probe card assembly 734 may include fewer or more substrates (e.g., 802, 960, 916) than the probe card assembly 734 as depicted in FIGS. 8-10. As another example, the probe card assembly 734 can include more than one probe substrate (e.g., 916), and each such probe substrate can be independently adjustable. Non-limiting examples of probe card assemblies with multiple probe substrates are disclosed in U.S. patent application Ser. No. 11/165,833, filed Jun. 24, 2005. Additional non-limiting examples of probe card assemblies are illustrated in U.S. Pat. No. 5,974,662 and U.S. Pat. No. 6,509,751 and the aforementioned U.S. patent application Ser. No. 11/165,833, filed Jun. 24, 2005, and various features of the probe card assemblies described in those patents and application may be implemented in the probe card assembly 734 shown in FIGS. 8-10.

Figure 13:
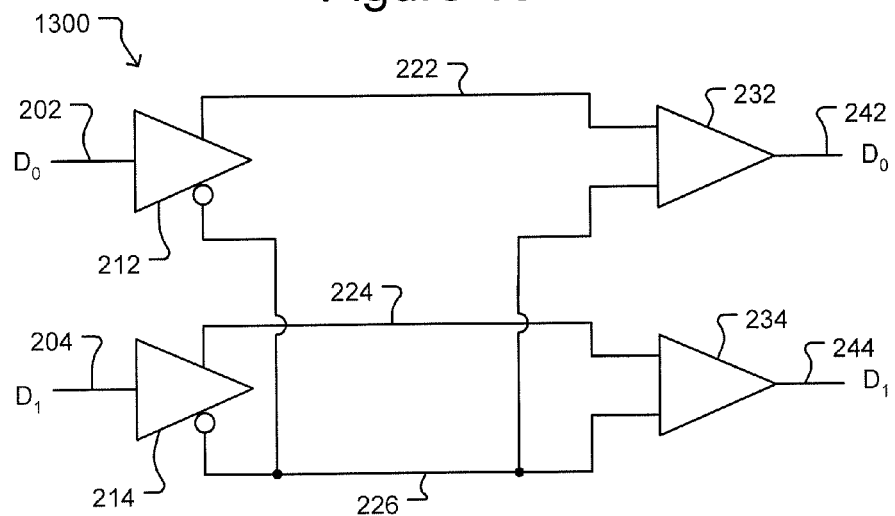
FIG. 13 illustrates a circuit that is an alternative configuration of the circuit 200 of FIG. 2 according to some embodiments of the invention.

FIG. 13 illustrates a simplified schematic diagram of a circuit 1300 for transmitting by differential signaling two data bits $D_0$, $D_1$ according to some embodiments of the invention. As will be seen, the circuit 1300 can be an alternative configuration of the circuit 200 of FIG. 2. For example, as shown in FIG. 13, circuit 1300 can include the drivers 212, 214, signal lines 222, 224, 226, and receivers 232, 234 of circuit 200 of FIG. 2. As shown in FIG. 13, in circuit 1300, driver 212 can drive the first bit $D_0$ onto signal line 222 and the complement of the first bit $D_0$ onto signal line 226. Driver 214 can drive the second bit $D_1$ onto signal line 224 and the complement of the second bit $D_1$ onto signal line 226. Thus, in the circuit 1300, signal line 226 is shared—that is, both driver 212 and driver 214 drive signals onto signal line 226—rather than signal line 224, which is a shared signal line in the circuit 200 of FIG. 2. Otherwise, circuit 1300 can be constructed and operate generally the same as circuit 200. For example, as discussed above, the drivers 212, 214 can be implemented as current sources (e.g., like the current sources 522, 524 of FIG. 5) as shown in FIG. 5 or voltage sources (e.g., like voltage sources 674, 578 of FIG. 6) and resistors (e.g., like resistors 674, 676, 678, 680 of FIG. 6) as shown in FIG. 6. As also discussed above, the receivers 232, 234 can be implemented as resistors (e.g., like resistors 562, 564 of FIGS. 5 and 6) disposed across inputs of differential amplifiers (e.g., like differential amplifiers 582, 584 of FIGS. 5 and 6) as shown in FIGS. 5 and 6.

Moreover, like circuits 200, 400, 500, and 600, the circuit 1300 of FIG. 13 can be utilized to transmit signals differentially through a probe card assembly, like the probe card assembly of FIGS. 8-10. For example, the drivers 1104, data paths 1106, and receivers 1108 of FIG. 11 as well as the drivers 1204, data paths 1206, and receivers 1208 of FIG. 12 can be configured in accordance with the circuit 1300 of FIG. 13 and implemented in the probe card assembly of FIGS. 8-10.

Figure 14:
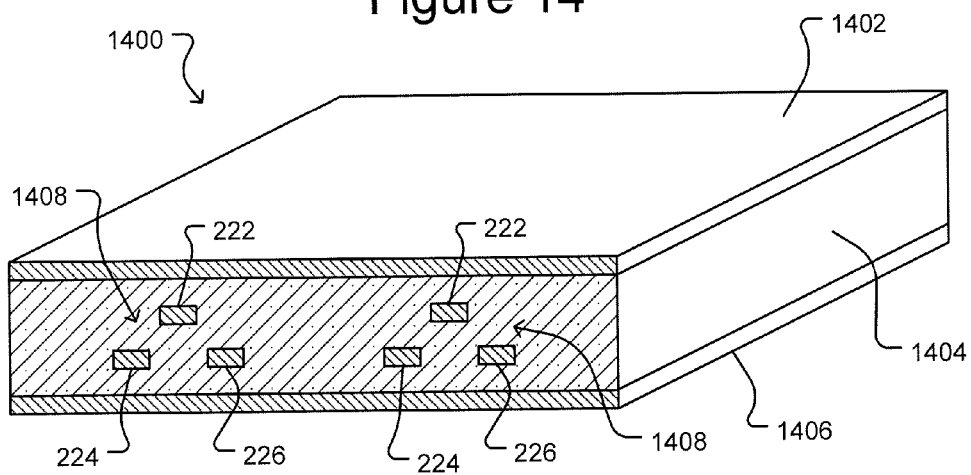
FIG. 14 shows exemplary groupings of the signal lines of the circuit of FIG. 13 embedded in a substrate according to some embodiments of the invention.

FIG. 14 illustrates a perspective, side cross-sectional view of an electronic device 1400 in which two sets 1408 (although more or fewer sets can be used) of the signal lines 222, 224, 226 of FIG. 13 are embedded and grouped to enhance common mode coupling according to some embodiments of the invention. As shown in FIG. 14, the electronic device 1400 can comprise a substrate 1404 (e.g., a printed circuit board substrate, a ceramic substrate, an organic substrate, an inorganic substrate, etc.), and ground planes 1402, 1404 (e.g., electrically conductive plates connected to ground). Alternatively, ground planes 1402, 1404 can be connected to voltage potentials other than ground. Ground planes 1402, 1404 can protect the signal lines 222, 224, 226 embedded in the substrate 1404 from outside electrical interference. The sets 1408 of signal lines 222, 224, 226 can comprise electrically conductive traces, embedded in the substrate 1404. As mentioned, FIG. 14 illustrates an exemplary grouping of the signal lines 222, 224, 226 to enhance common mode coupling of two or more of the signal lines 222, 224, 226 in each group 1408. Although not shown in FIG. 14, circuitry implementing drivers 212, 214 and receives 232, 234 can be attached to or embedded in the substrate 1404. The electronic component 1400 can be any electronic component, including without limitation a portion of a probe card assembly (e.g., like the probe card assembly of FIGS. 8-10), a printed circuit board, etc.

Figure 15:
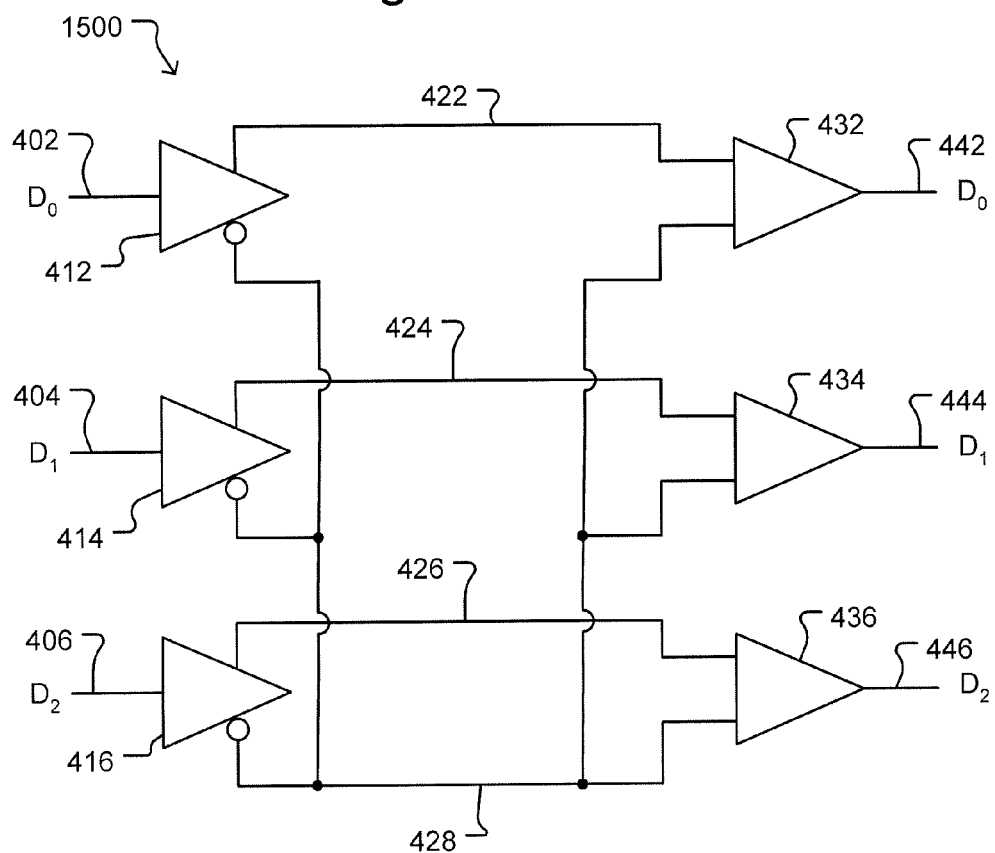
FIG. 15 illustrates a circuit that is an alternative configuration of the circuit 400 of FIG. 2 according to some embodiments of the invention.

FIG. 15 illustrates a simplified schematic diagram of a circuit 1500 for transmitting by differential signaling three data bits $D_0$, $D_1$, $D_2$ according to some embodiments of the invention. As will be seen, the circuit 1500 can be an alternative configuration of a three-bit version of the circuit 400 of FIG. 4, although FIG. 1500 can be expanded, generally as shown in FIG. 4, to transmit more than three bits. As shown in FIG. 15, circuit 1500 can include the drivers 412, 414, 416, signal lines 422, 424, 426, 428 and receivers 432, 434, 436 of circuit 400 of FIG. 4. As shown in FIG. 15, in circuit 1500, driver 412 can drive the first bit $D_0$ onto signal line 422 and the complement of the first bit $D_0$ onto signal line 428. Driver 414 can drive the second bit $D_1$ onto signal line 424 and the complement of the second bit $D_1$ onto signal line 428. Driver 416 can drive the third bit $D_2$ onto signal line 426 and the complement of the third bit $D_2$ onto signal line 428. Thus, in the circuit 1500, signal line 428 is shared—that is, each of drivers 412, 414, 416 can drive signals onto signal line 428—rather than signal line 424 and signal line 426, which are shared signal lines in the circuit 400 of FIG. 4 configured to transmit three bits. Otherwise, circuit 1500 can be constructed and operate generally the same as circuit 400. For example, as discussed above, the drivers 412, 414, 416 can be implemented as current sources (e.g., like the current sources 522, 524, 526 of FIG. 5) as shown in FIG. 5 or voltage sources (e.g., like voltage sources 674, 578 of FIG. 6) and resistors (e.g., like resistors 674, 676, 678, 680 of FIG. 6) as shown in FIG. 6.

Moreover, like circuits 200, 400, 500, 600, and 1300, the circuit 1500 of FIG. 15 can be utilized to transmit signals differentially through a probe card assembly, like the probe card assembly of FIGS. 8-10. For example, the drivers 1104, data paths 1106, and receivers 1108 of FIG. 11 as well as the drivers 1204, data paths 1206, and receivers 1208 of FIG. 12 can be configured in accordance with the circuit 1500 of FIG. 15 and implemented in the probe card assembly of FIGS. 8-10.

Figure 16:
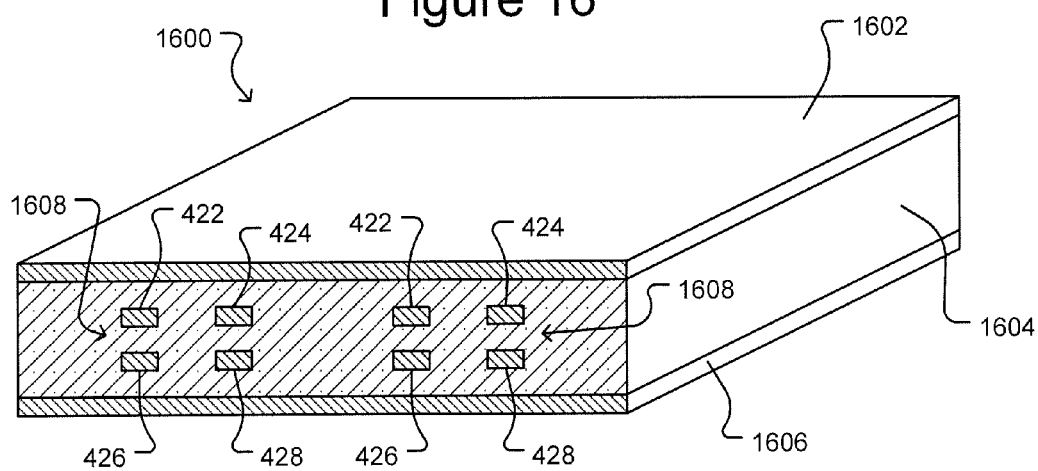
FIG. 16 shows exemplary groupings of the signal lines of the circuit of FIG. 15 embedded in a substrate according to some embodiments of the invention.

FIG. 16 illustrates a perspective, side cross-sectional view of an electronic device 1600 in which two sets 1608 (although more or fewer sets can be used) of signal lines 422, 424, 426, 428 are embedded and grouped to enhance common mode coupling according to some embodiments of the invention. As shown in FIG. 16, the electronic device 1600 can comprise a substrate 1604 (which can be like substrate 1404 of FIG. 14) and ground planes 1602, 1604 (which can be like ground planes 1402, 1404 of FIG. 14). The sets 1608 of signal lines 422, 424, 426, 428 can comprise electrically conductive traces, embedded in the substrate 1604. As mentioned, FIG. 16 illustrates an exemplary grouping of the signal lines 422, 424, 426, 428 to enhance common mode coupling of two or more of the signal lines 422, 424, 426, 428 in each group 1608. Although not shown in FIG. 16, circuitry implementing drivers 412, 414, 416 and receives 432, 434, 436 can be attached to or embedded in the substrate 1604. The electronic component 1600 can be like electronic component 1300 of FIG. 13.

Figure 17:
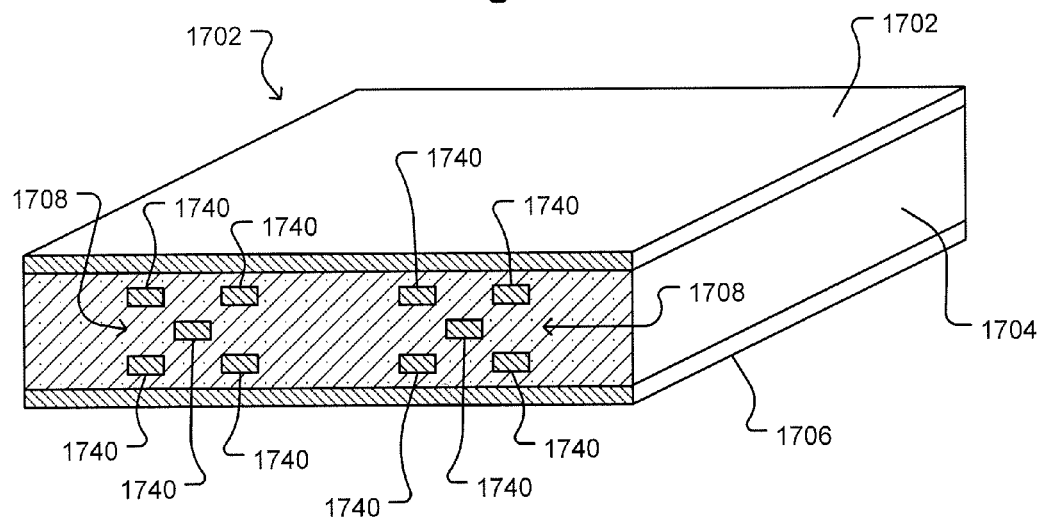
FIG. 17 shows exemplary groupings of five signal lines embedded in a substrate according to some embodiments of the invention.

FIG. 17 illustrates a perspective, side cross-sectional view of an electronic device 1700 in which two sets 1708 (although more or fewer sets can be used) of five signal lines 1740 are embedded and grouped to enhance common mode coupling according to some embodiments of the invention. As shown in FIG. 17, the electronic device 1700 can comprise a substrate 1704 (which can be like substrate 1404 of FIG. 14) and ground planes 1702, 1704 (which can be like ground planes 1402, 1404 of FIG. 14). The sets 1708 of five signal lines 1740 can comprise electrically conductive traces, embedded in the substrate 1704. As mentioned, FIG. 17 illustrates an exemplary grouping of the signal lines 1740 to enhance common mode coupling of two or more of the signal lines 1740 in each group 1708.

The schematics shown in FIGS. 2-6 and 11-13 can also be implemented in an electronic component, like electronic component 1400, 1600, or 1700.

In any of the embodiments described herein, it may be possible to describe the signal lines using a first or second characterization although such a description is not intended to limit the scope of the invention but is merely provided for descriptive purposes. For example, an unshared signal line (e.g., a signal line driven by only one driver) can be considered a first signal line and plurality of unshared signal lines can be considered a first plurality of signal lines. As another example, a shared signal line (e.g., a signal line driven by more than one driver) can be considered a second signal line and a plurality of shared signal lines can be considered a second plurality of signal lines.

Although specific embodiments and applications of the invention have been described in this specification, there is no intention that the invention be limited these exemplary embodiments and applications or to the manner in which the exemplary embodiments and applications operate or are described herein.

What is claimed is:

1. A system for transmitting a plurality of signals differentially, the system comprising:
a plurality of differential signal transmitters each comprising transmitter outputs, wherein there are a plurality of at least four of the transmitter outputs;
a plurality of at least three conductive signal lines electrically connected to the plurality of transmitter outputs, wherein a first of the signal lines is electrically connected to one and only one of the transmitter outputs, a second of the signal lines is electrically connected to more than one of the transmitter outputs, and a third of the signal lines is electrically connected to one and only one of the transmitter outputs.

2. The system of claim 1, wherein the transmitters comprise current sources.

3. The system of claim 1, wherein the transmitters comprise voltage sources.

4. The system of claim 1, wherein each of a first plurality of the signal lines is electrically connected to one and only one transmitter output, and each of a second plurality of the signal lines is electrically connected to more than one of the transmitter outputs.

5. The system of claim 1, wherein each of the transmitters comprises one of the transmitter outputs configured to output a signal and another of the transmitter outputs configured to output a compliment of the signal.

6. The system of claim 5, wherein the second of the signal lines is electrically connected to the one of the transmitter outputs of one of the transmitters and to the other of the outputs of another of the transmitters.

7. The system of claim 6 further comprising a plurality of receivers, wherein the first of the signal lines is electrically connected to one and only one input of one and only one of the receivers, the second of the signal lines is electrically connected to the inputs of more than one of the receivers, and the third of the signal lines is electrically connected to one and only one input of the receivers.

8. The system of claim 7, wherein the receivers comprise differential amplifiers.

9. The system of claim 7, wherein the system further comprises a probe cad assembly comprising an interface to a tester and a plurality of probes disposed to contact an electronic device to be tested.

10. The system of claim 9, wherein:
an input of each transmitter in a first set of the transmitters is electrically connected to the tester interface, and
an output of each receiver in a first set of the receivers is electrically connected to one of the probes.

11. The system of claim 10, wherein:
an input of each transmitter in a second set of the transmitters is electrically connected to one of the probes, and
an output of each receiver in a second set of the receivers is electrically connected to the tester interface.

12. The system of claim 7, wherein the signal lines electrically connect a tester with a probe card assembly comprising probes configured to contact an electronic device to be tested.

13. The system of claim 12, wherein a first set of the transmitters and a first set of the receivers are disposed at the tester, and a second set of the transmitters and a second set of the receivers are disposed on the probe card assembly.

14. A method of transmitting a plurality of data signals, the method comprising:
driving a plurality of at least four transmission signals onto at least three signal lines, the transmission signals comprising complimentary pairs of signals, each pair corresponding to one of the data signals, wherein one and only one of the transmission signals is driven onto a first of the signal lines, more than one of the transmission signals are driven onto a second of the signal lines, and one and only one of the transmission signals is driven onto a third of the signal lines.

15. The method of claim 14, wherein one and only one of the transmission signals is driven onto a first plurality of the signal lines, and more than one of the transmission signals are driven onto a second plurality of the signal lines.

16. The method of claim 14 further comprising:
receiving from the signal lines the transmission signals, and
converting the complimentary pairs of transmission signals into the data signals.

17. The method of claim 14, wherein the driving step comprises converting each of the data signals into one of the complimentary pairs of the transmission signals.

18. The method of claim 14, wherein at least a portion of each of the signal lines is disposed on a probe card assembly comprising an interface to a tester and a plurality of probes disposed to contact an electronic device.

19. The method of claim 18, wherein test signals to be input into the electronic device to be tested are transmitted differentially through the probe card assembly.

20. The method of claim 19, wherein response signals generated by the electronic device to be tested in response to the test signals are transmitted differentially through the probe card assembly.

21. A system for transmitting a plurality of signals differentially, the system comprising a first circuit configured to transmit N data signals, the first circuit comprising:
N transmitters each comprising a first output configured to output one of the N data signals and a second output configured to output a compliment of the one of the N data signals, and
N+1 signal lines connected to the outputs of the N transmitters, wherein a first of the signal lines is connected to one and only one output of one and only one of the transmitters, a second of the signal lines is connected to outputs from more than one of the transmitters, and a third of the signal lines is connected to one and only one output of one and only one of the transmitters, wherein N is at least two.

22. The system of claim 21, wherein the first circuit further comprises N receivers each comprising a first input and a second input, wherein the signals lines are connected to the inputs of the receivers and the first of the signal lines is connect to one and only one input of one and only one of the receivers, the second of the signal lines is connected to inputs of more than one of the transmitters, and the third of the signal lines is connected to one and only one input of one and only one of the receivers.

23. The system of claim 21 further comprising a second circuit configured to transmit N data signals, the second circuit comprising:
N transmitters each comprising a first output configured to output one of the N data signals and a second output configured to output a compliment of the one of the N data signals, and
N+1 signal lines connected to the outputs of the N transmitters of the second circuit, wherein a first of the signal lines is connected to one and only one output of one and only one of the transmitters, a second of the signal lines is connected to outputs from more than one of the transmitters, and a third of the signal lines is connected to one and only one output of one and only one of the transmitters,
whereby the system is configured to transmit differentially 2N data signals over 2(N+1) signal lines.

24. A method of transmitting a plurality of data signals, the method comprising:
transmitting N data signals as 2N transmission signals over N+1 transmission lines, wherein one and only one transmission signal is transmitted over a first of the transmission lines and one and only one transmission signal is transmitted over a second of the transmission lines, wherein N is at least two.

25. The method of claim 24, wherein the transmission signals comprise complimentary pairs of signals, each pair corresponding to one of the data signals.

26. The method of claim 25, wherein the transmitting step comprises transmitting each pair of signals on adjacent transmission lines.

27. The method of claim 25 further comprising receiving each pair of signals and converting each pair of signals into the corresponding data signal.

* * * * *